United States Patent [19]
Chambers, IV

[11] Patent Number: 5,155,484
[45] Date of Patent: Oct. 13, 1992

[54] FAST DATA COMPRESSOR WITH DIRECT LOOKUP TABLE INDEXING INTO HISTORY BUFFER

[75] Inventor: Lloyd L. Chambers, IV, Menlo Park, Calif.

[73] Assignee: Salient Software, Inc., Palo Alto, Calif.

[21] Appl. No.: 759,226

[22] Filed: Sep. 13, 1991

[51] Int. Cl.$^5$ .............................................. H03M 7/42
[52] U.S. Cl. ...................................... 341/55; 341/106
[58] Field of Search ........................... 341/55, 106, 50

[56] References Cited

U.S. PATENT DOCUMENTS

| | | | |
|---|---|---|---|
| 4,988,998 | 1/1991 | O'Brien | 341/55 |
| 5,016,009 | 5/1991 | Whiting et al. | 341/106 X |
| 5,049,881 | 9/1991 | Gibson et al. | 341/55 X |

*Primary Examiner*—Sharon D. Logan
*Attorney, Agent, or Firm*—Fliesler, Dubb, Meyer & Lovejoy

[57] ABSTRACT

A cooperating data compressor, compressed data format, and data decompressor. The compressor compresses an input data block (HB) to a compressed data block having the format. The decompressor decompresses the compressed data block to restore the original data block. The compressor has a direct lookup table (DLT) of $2^{8 \times N}$ entries, each indexable by N bytes at a current HB location and identifying a target HB location. The compressor determines whether a target string at the target HB location matches a current string at the current HB location. If they do not match, the compressor outputs a literal representing a datum at the current location. If they match, the compressor outputs a vector from the current location to the target string. Compression speed is maximized by the direct addressing of the DLT by the current N bytes in the HB. Decompression speed is maximized by state machine operation according to literal/vector indicators, special case string length codes, and special case offset codes in the compressed data format.

56 Claims, 12 Drawing Sheets

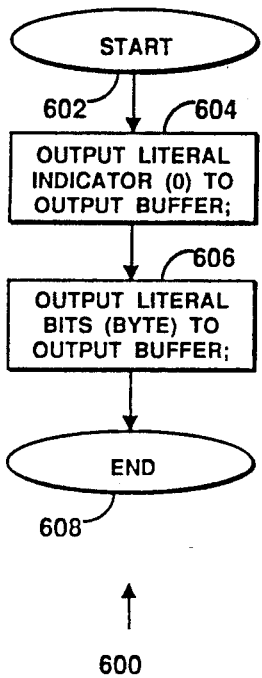
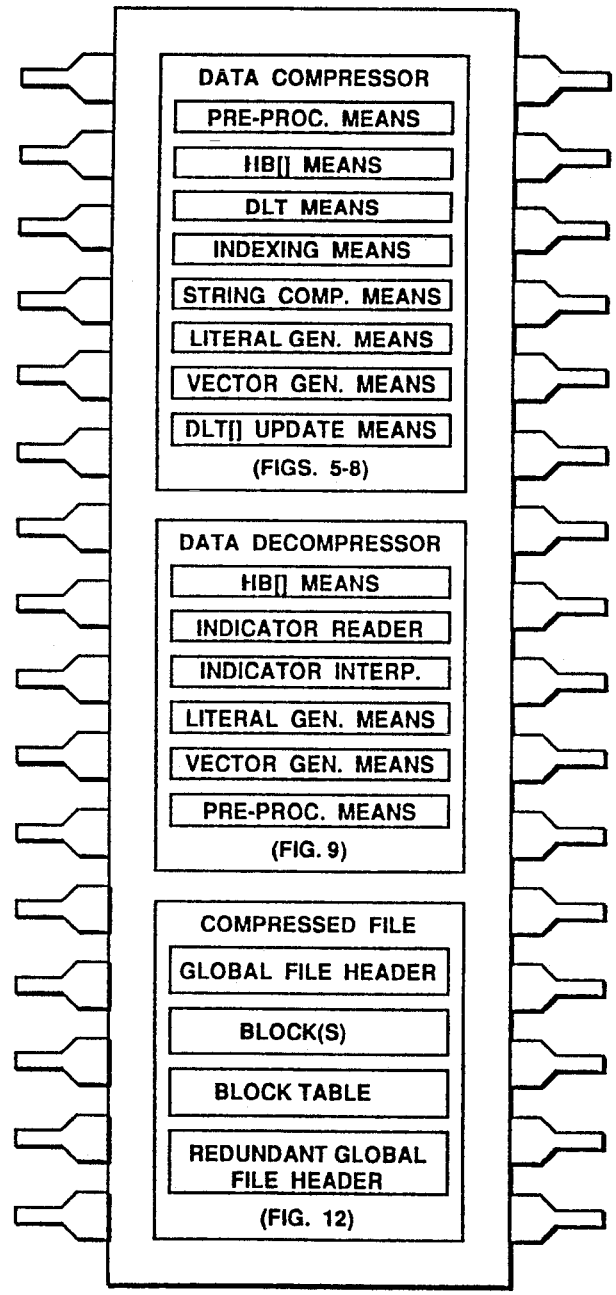
Fig. 6
Fig. 11

FAST DATA COMPRESSOR WITH DIRECT LOOKUP TABLE INDEXING INTO HISTORY BUFER

BACKGROUND OF THE INVENTION

1. Field of the Invention

The present invention relates generally to data compressors and decompressors, and more particularly to a fast data compressor performing a new compression method and to a fast data decompressor performing a corresponding new decompression method.

2. Description of the Background

It is well known in the computer arts that given data occupying a given number of bytes may be fully represented by other data occupying a smaller number of bytes. In other words, the given data may be compressible. In order for compression to be useful, there must exist a method of reconstructing the original data. In other words, the compressed data must be decompressible.

Data compression is useful in a variety of circumstances. For example, compressed data will occupy less storage on a permanent storage medium such as a hard disk or a floppy disk, thereby permitting the disk to effectively hold an increased amount of data. This eliminates the expense otherwise required in purchasing a larger hard disk or more floppy disks.

As another example, compressed data will take less time to transfer over a communication link. This reduces expenses associated with data transmission, such as long-distance telephone charges, bulletin board use charges, bulletin board connect time, and user wait time.

An increasingly more important example is the computer network. Networked computers and servers transfer data amongst themselves in the form of "packets" of a given number of bytes. Increasing the effective data content of those bytes increases the packet content and the network throughput.

Yet another example is a computer system having virtual memory. The virtual memory system is constructed to allow user programs and the like to have seeming access to a greater quantum of random access memory (RAM) than the computer system is actually equipped with. At times, certain memory pages may need to be "swapped out" to non-RAM storage to make room for new data in RAM. Typically, the pages are swapped out to a hard disk. If the pages are compressed before being swapped out, they will not only occupy less space on the hard disk, but will be written to the disk in a shorter amount of time, and will also be read from the disk (swapped in) in a shorter amount of time, as well. Ideally, the compression and decompression will operate in a shorter amount of time than the decrease in transmission time.

As another example, data may be stored in a read-only memory (ROM) in a compressed form, and may be decompressed in part or in whole when the ROM is read.

Data compression and decompression may be performed in a variety of manners. For example, a stand-alone program may be used to compact files on a hard disk whenever the hard disk begins to become full. Then, when the compacted files are needed at some future date, a corresponding decompression program may be used to decompress the desired files.

Alternatively, the compression and decompression may be performed transparently by a "driver" which is used to access the hard disk. The compressor and decompressor are, in effect, a "front end" of the hard disk. In such a configuration, the disk may advantageously store only compressed data. The user application or other entity reading data from, or writing data to the hard disk need never know that the compression and decompression are taking place. This front end technique may be performed either in software or, more advantageously, in hardware. The front end may also be built into either the computer or the hard disk drive.

A variety of compression and decompression techniques are well-known in the art, including such techniques as: Huffman encoding, Lempel-Ziv encoding, and Run Length Encoding (RLE). Those techniques have certain drawbacks which are desirable to overcome. For example, they are generally non-self-recovering, meaning that if their compressed data becomes corrupted by even one "bit", the entire data will likely be irretrievably corrupted upon decompression. Even worse, such errors may cause "data explosion" in which the decompressor is unable to determine when to stop decompressing and generates erroneous data forever, or until the computer runs out of memory or otherwise crashes.

More significantly, the previously-known techniques have proven to be unacceptably slow, both in compressing and in decompressing data. Those skilled in the art are aware that data files (including text files, graphics files, stand-alone programs, and the like) are, on the average, much larger today than at the time the previously-known techniques were conceived. The larger data files simply take too long to compress and decompress using the previously-known techniques.

Data compression typically takes advantage of the fact that most data contains repeated strings of bytes. Prior techniques maintain "dictionaries" of previously-encountered strings of bytes. In some schemes, the dictionaries are embedded in the compressed data file, to enable the decompression of the data. Other schemes reconstruct the dictionaries at decompression time. Storage and transfer of the dictionaries are wasteful of media and bandwidth. Dictionary reconstruction is an unacceptably severe performance penalty to pay at each decompression.

In order to determine whether a given string has previously been encountered, prior techniques generally employ some sort of hashing function to access the dictionary. Hashing consumes computational resources, and slows down both the compression and the decompression of data.

Presently, data compression and decompression come in two varieties: "loss-less" and "lossy". The less desirable "lossy" compression is used in situations where absolute data integrity is not required. For example, compressed video images may be acceptably accurate when restored in a "lossy" form, in which a small degree of their detail or color variation has been lost. "Lossy" compression is generally deemed acceptable when the lost data is outweighed in importance by increased compression ratios or by improved compression or decompression times.

By way of contrast, the "loss-less" variety is employed when absolute data integrity outweighs other such factors. For example, when a user application program is to be compressed for storage or transmission and then decompressed, it is absolutely essential that the compression and decompression be one hundred percent "loss-less". The loss or corruption of even a single machine instruction may render the restored version useless at best, and perhaps even dangerous.

Therefore, what is needed is an improved data compressor and an improved data decompressor. These should have improved throughput, and should be self-recovering in the event of data corruption. It is desirable that the compressor and decompressor operate without the creation of a separate dictionary, and even more desirable that no dictionary be embedded in the compressed data file. It is further desirable that neither the compressor nor the decompressor requires a hashing function. It is further desirable that the compressor and decompressor operate to perform "loss-less" compression and decompression, and still further desirable that the compression and decompression be performed at an improved speed.

SUMMARY OF THE INVENTION

The present invention is an apparatus, and corresponding method, operating upon an input data block. The apparatus includes means for maintaining a direct lookup table (DLT) array of DLT entries, each DLT entry being indexable in the DLT by a unique integer and identifying a location in the input data block. The apparatus further includes indexing means for using one or more bytes at a current location in the input data block as an integer to directly access a given DLT entry, contents of the given DLT entry identifying a target location in the input data block.

Target strings begin at target locations in the input data block and a current string begins at the current location. The apparatus further includes string comparison means for determining whether a target string at a target location identified by the given DLT entry matches the current string.

The apparatus further includes data compression means for compressing the input data block responsive to the string comparison means, to generate a compressed data block. The data compression means includes literal means, responsive to a determination by the string comparison means that the target and current strings do not match, for outputting to the compressed data block a literal representing a datum at the current location. The data compression means further includes vector means, responsive to a determination by the string comparison means that the target and current strings match, for outputting to the compressed data file a vector to the target string.

The indexing means uses N bytes at the current location to index the DLT, where N is an integer, and the means for maintaining the DLT maintains the DLT to comprise $2^{8 \times N}$ DLT entries. In one mode, the DLT includes sixty-four kiloentries ($2^{2 \times 8}$ DLT entries), and the indexing means uses a current byte at the current location and a next byte at a next subsequent location to index the DLT.

Thus, in one mode, the apparatus is a data compressor. The apparatus, and corresponding method, include a data decompressor adapted to decompress data which has been compressed by the data compressor.

In another aspect, the invention is a compressed data file according to a given file format. In another aspect, the invention is a compressed data block according to a given block format. The file format includes a global file header, one or more data blocks, a block table, and an optional redundant global file header. The block format includes a block header and a block of compressed data according to a compressed data format, or copied data. The compressed data format includes at least one literal, and at least one vector.

BRIEF DESCRIPTION OF THE DRAWINGS

FIG. 6 is a flowchart depicting operation of the data compressor to output a literal.

FIGS. 10 and 11 respectively show the data compressor and data decompressor of the present invention embodied as software in a floppy disk or the like and as firmware in a logic device such as a ROM or the like, and further show a compressed data file according to the file format of the present invention also embodied in a floppy disk and a logic device.

DETAILED DESCRIPTION OF THE PREFERRED EMBODIMENTS

Figure 1:
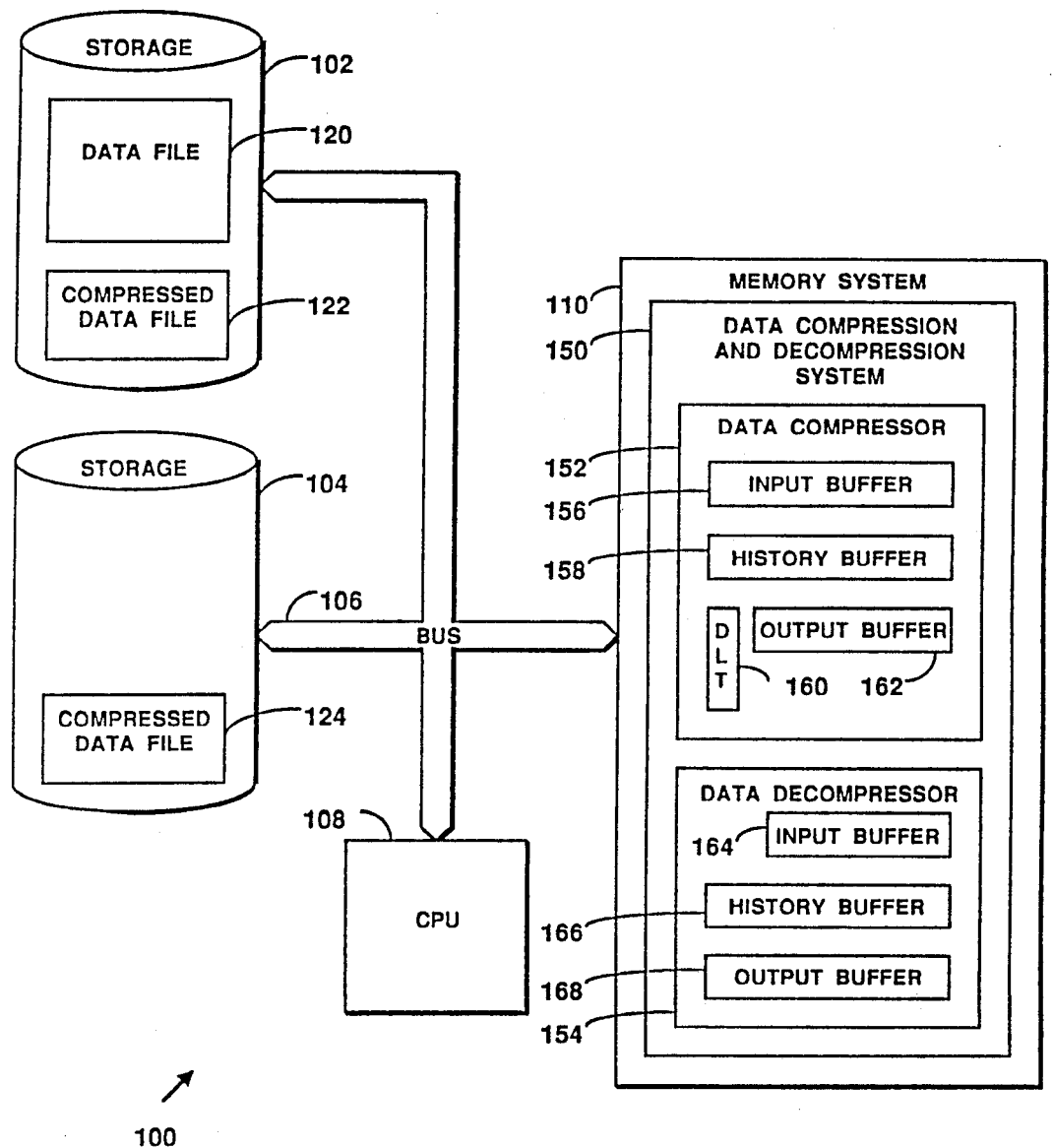
FIGS. 1-3 illustrate data compression performed in an archival system, a communication system, and a network system.

Hereinbelow, the first digit of each drawing reference numeral identifies the Fig. in which the referenced item may be found. For example, the item 106 is found in FIG. 1, and the item 908 is found in FIG. 9.

I. DATA COMPRESSION AND DECOMPRESSION ENVIRONMENTS

A. Archival System Environment

FIG. 1 illustrates one environment in which the data compression and decompression of the present invention may advantageously be employed, in which a computer system 100 is configured as an archival system. The computer system includes two permanent storage devices 102 and 104, such as hard disk drives, floppy disk drives, tape storage devices, magneto-optical drives, or the like. The storage devices are coupled to a bus 106 which is further coupled to a central processing unit (CPU) 108 and memory 110.

A first data file 120 is stored on the first storage device, occupying a given quantum of storage, for example, five hundred twelve kilobytes. The first data file may be compressed according to the present invention, and may be stored as a compressed data file 122 stored on the first storage device or as a compressed data file 124 stored on the second storage device. The compressed data file will, unless the first data file is incompressible, occupy a smaller quantum of the permanent storage, for example, two hundred fifty-six kilobytes.

In one mode of operation, the first data file may then be deleted from the first storage device, freeing up its quantum of storage. In one mode, the second storage device may contain only compressed data files. In one mode, every data file on the first storage device may be mirrored by a compressed data file on the second storage device. Many such modes of configuration are possible.

In performing the data compression, typically, the first data file may be copied from the first storage device to the memory, one block at a time or in toto, as described below. The CPU will then perform operations according to the present method, upon the current block in memory to form a compressed block. The compressed block is then written back to one or both of the storage devices.

The data compression and decompression system 150 of the present invention may, during operation, reside in the memory of the computer. The data compression and decompression system 150 includes a data compressor 152 and a data decompressor 154.

The data compressor optionally includes an input buffer 156 into which blocks of the first data file are sequentially loaded. The data compressor includes a history buffer 158 and a direct lookup table (DLT[]) 160 which are key to performing the data compression method, as will be explained below. The data compressor optionally includes an output buffer 162 into which compressed data are written as a compressed block. The compressed block may then be written to the compressed data file.

The data decompressor optionally includes an input buffer 164 into which compressed blocks are loaded from the compressed data file. The data decompressor further includes a history buffer 166 to which decompressed data are written as they are generated. The data decompressor optionally includes an output buffer 35 through which the decompressed contents of the history buffer are written, to reconstruct the first data file from the compressed data file.

B. Communication System Environment

Figure 2:
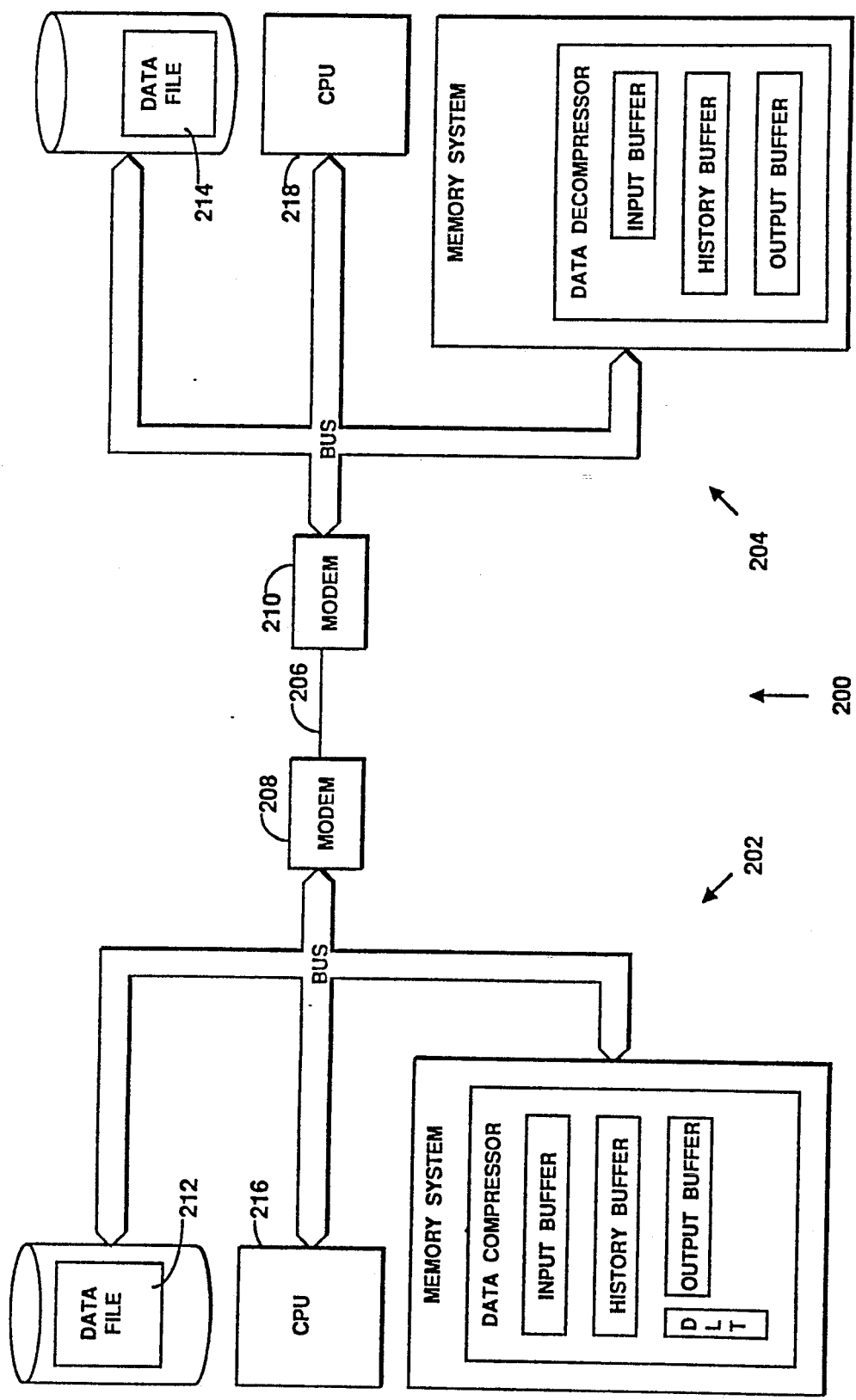

FIG. 2 illustrates yet another environment in which the invention may be practiced. In the communication system 200 of FIG. 2, a first computer system 202 is first coupled to a second computer system 204 over a communication link 206, via the use of modems 208 and 210 at either end of the communication link. To maximize throughput of the transmission of the data file 21 from the first computer system to the second computer system, the present invention may advantageously be utilized to compress the data file before transmission, and then to decompress the transmission to reconstitute the data file 314 at the other end.

In one mode, the first computer's CPU 216 will perform the compression method of the present invention, and the second computer's CPU 218 will perform the decompression method of the present invention. Thus, fewer bytes are transmitted over the modems, maximizing utilization of the available bandwidth of the modems and the transmission link.

In another mode, the compression and decompression may be performed within the modems, reducing the workload on the computer systems' CPUs.

C. Computer Network Environment

Figure 3:
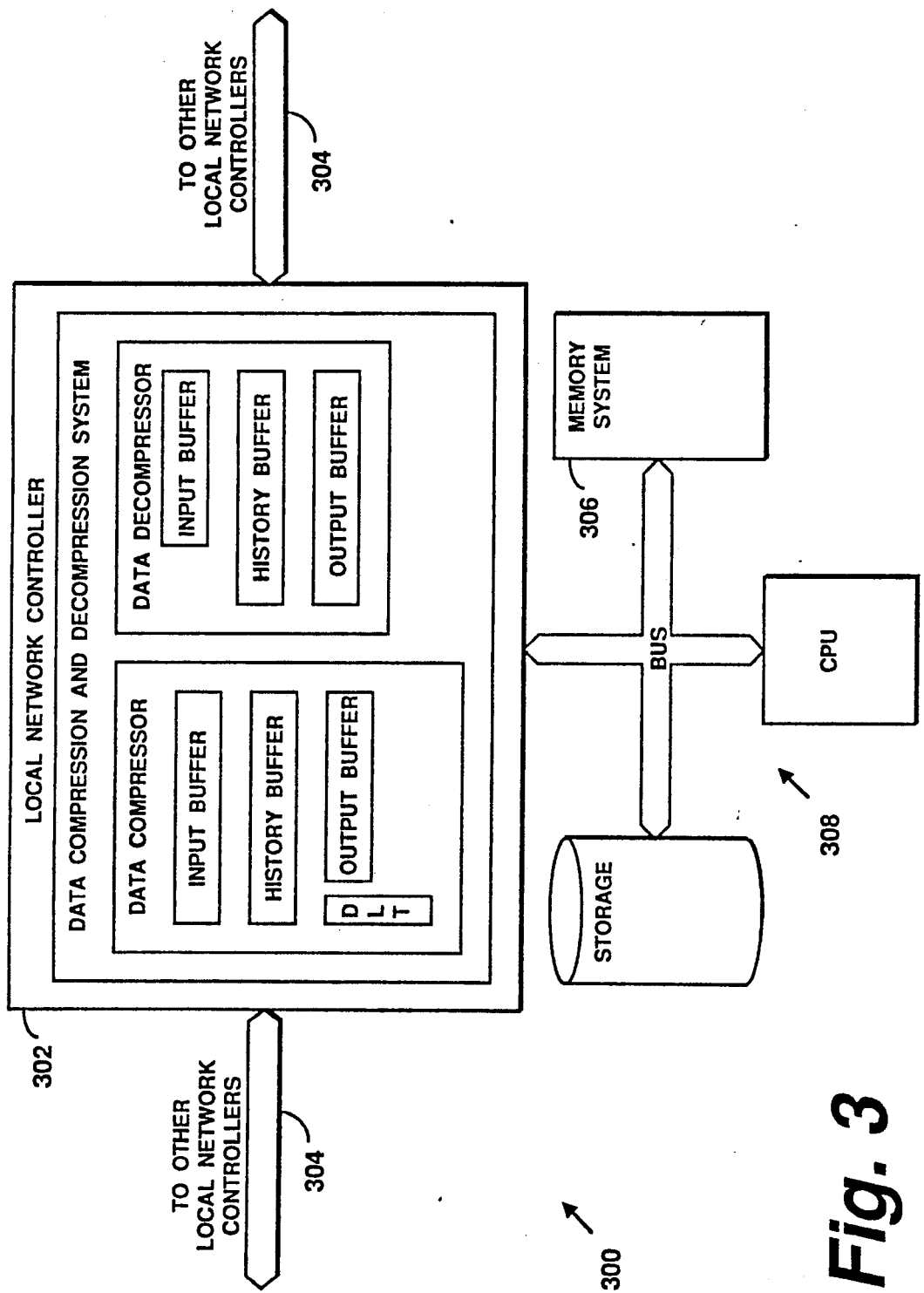

FIG. 3 illustrates a still further environment in which the present invention may advantageously be utilized. FIG. 3 shows one node 300 of a computer network system. As is known in the computer art, data files, messages, and other information are transferred along computer networks in the form of "packets". Each packet includes a predetermined quantum of actual data, with accompanying network packet information.

A local network controller 302 receives and transmits packets (not shown) along the network branches 304. The network packet information includes an identification of the intended destination node of the packet. If the local network controller is coupled to the indicated destination, the local network controller routes the packet to the memory 306 of the destination computer 308. Otherwise, the local network controller forwards the packet on the network to the next node's controller (not shown).

Packets, or at least the data information portion thereof, may advantageously be transmitted and received between controllers in a compressed form according to the present invention. When a local node's computer transmits a packet, the local node's local network controller may advantageously perform a compression on the data information portion of the packet before transmitting the packet. Then, the destination node's local network controller may perform a corresponding decompression, to reconstitute the original packet. Alternatively, the compression and decompression could be performed by the respective nodes' computers, rather than by the local network controllers. Thus, each packet may be made to hold an effectively increased quantum of actual data. This improves network throughput not only in that the actual data portion of each packet is effectively increased, but also in that the network packet information penalty is spread over an effectively larger quantum of actual data.

II. GENERAL OPERATION

The data compressor and decompressor of the present invention performs a new data compression and decompression method known as the "Chambers' Pairs" method. The details of operation of the data compressor and the data decompressor will be explained with reference to FIG. 4 and with respect to the environment of FIG. 1. However, it will be understood that the compression and decompression methods may similarly be performed in any other suitable environment, including, but not limited to, the other environments described above.

A. General Operation of the Data Compressor

Figure 4:
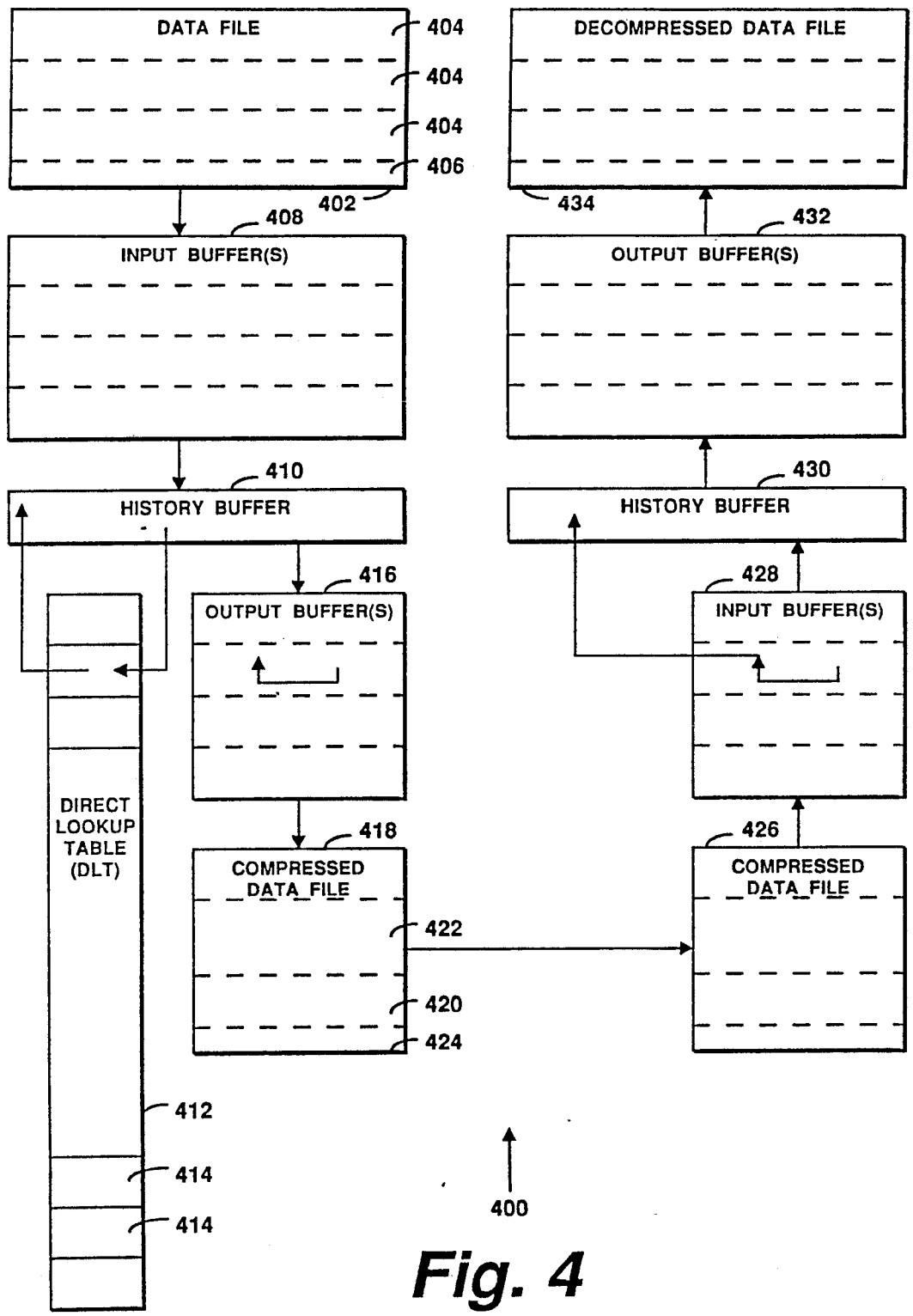
FIG. 4 illustrates uncompressed and compressed and decompressed data files, and the input and output buffers, history buffers, and direct lookup table employed by the present invention.

FIG. 4 shows the general data structures used by the data compression and decompression system 400 of the present invention. The data compressor of the present invention, unlike previously known data compressors, does not operate upon an entire data file 402 at once. Rather, the data compressor operates upon individual blocks 404 of the data file independently and sequentially. The data compressor may operate directly upon individual blocks of the data file, or the blocks may first be loaded into an input buffer 408 by conventional control means (not shown).

From the input buffer, a block is loaded into a history buffer (HB[]) 410 of a first predetermined size HBSIZE. Each block may advantageously be the same size as the history buffer. What the present invention's data compressor compresses is the contents of the history buffer. By sequentially copying individual blocks of the data file to the history buffer, the whole of the data file may ultimately be compressed.

The history buffer may be of any predetermined size. In theory, a one-byte history buffer is feasible, although this will never result in any data compression because no "memory" of any past history will ever be achieved. It has been observed that the compression ratio is quite low with a very small history buffer, but improves dramatically at somewhere around a one-kilobyte history buffer. Between one and eight kilobytes, the compression ratio remains somewhat constant. If the history buffer is made too large, too much compression overhead data will result, as will be explained below. It has been observed that, for most data, a good trade-off point is achieved with a four-kilobyte history buffer. It has been observed that, for hard-to-compress data, a somewhat smaller history buffer may be desirable, for example, a one-kilobyte history buffer. In the network environment of FIG. 3, the history buffer should, of course, be substantially the same size as one network packet.

As will be explained below, the data compressor scans through the history buffer, periodically making entries into a direct lookup table (DLT[]) 412 of a second predetermined size DLTSIZE. The DLT[] includes a plurality of DLT entries 414. The data compressor outputs compressed data to an output buffer (OB[]) 416 of a third predetermined size OBSIZE, where

OBSIZE >= (HBSIZE * 9/8) + 1 to allow for expansion of non-compressible data, as will be understood from the explanation below concerning FIG. 6. In compressing the whole of the data file, each sequential block's compressed data may be appended to the output buffer or may be placed in its own output buffer, and the output buffers may then be appended in series.

The contents of the output buffer(s) may be then be written back to the storage device as a compressed data file 418. Alternatively, the compressed data might be written directly "on-the-fly" to the compressed data file on the storage device, without an intervening output buffer.

The following pseudocode routine in Table 1 generally illustrates the data compression method of the data compressor of the present invention.

TABLE 1

Data Compression Method

```
CUR = 0;
LAST = HBSIZE - 1;
while (CUR <= LAST)
{   INDEX = HB[CUR] with HB[CUR+1];
    START = CUR;
    MATCH = HB[DLT[INDEX]];
    if (HB[MATCH] == HB[CUR])
    {   if (MATCH > START) /* not a valid vector */
        {   goto LITERAL;
        }
        else
        {   begin matching a string by comparing
                HB[CUR+i] to HB[MATCH+i]
                until no match or
                until maximum length is reached
            if ( length of matched string < 2)
            {   goto LITERAL;
            }
            else
            {   output vector;
            }
        }
    }
    else
    {   LITERAL:
```

TABLE 1-continued

Data Compression Method

```
        output literal;
    }
    DLT[INDEX] = CUR;
    CUR = CUR + number of bytes processed;
}
```

The data compressor requires no dictionaries, no hashing functions, and no hash tables.

FIG. 4 symbolically shows that data at the current location in the history buffer form an INDEX to a particular DLT entry in the DLT[], and how that DLT entry may include a reference back to a previously-found string in the history buffer. FIG. 4 also symbolically shows that the output buffer may include a vector which references back, representative of the indexing from the history buffer through the DLT[] to the previously-found matching string. Note tat neither the vector's offset nor its length applies to the output buffer; rather, they apply to a subsequently-recreated history buffer, as is also symbolically shown in FIG. 4.

B. General Operation of the Data Decompressor

Like the data compressor, the data decompressor requires no dictionaries, no hashing functions, and no hash tables to decompress a compressed data file 426, or rather, individual blocks thereof. The blocks may be decompressed directly from the data file or through intervening input buffer(s) 428 loaded by conventional means (not shown).

The data decompressor uses only a history buffer (HB[]) 430, which is the same size as, or larger than, the history buffer 410 of the data compressor. If the history buffer 430 is larger than the history buffer 410, any excess portion of the history buffer 430 will be unused.

The data decompressor begins operating at the beginning of the compressed data file and continues until the history buffer is filled. The history buffer is then written (optionally through one or more output buffers 432) to the decompressed data file 434 in its entirety. Operation of one invocation of the data decompressor is then complete.

Like the data compressor, the data decompressor may be repeatedly invoked when dealing with data files larger than one history buffer. Upon a subsequent invocation, the data decompressor may resume operations at a point in the compressed data file at which it left off in a previous invocation, and filling of the history buffer begins again.

The following pseudocode routine generally illustrates the data compression method of the data decompressor of the present invention.

TABLE 2

Data Decompression Method

```
while (HB[] has space remaining)
{   if (next bit is literal indicator)
    {   fetch next eight bits and append to HB[CUR];
    }
    else /* vector indicator */
    {   decode OFFSET;
        decode LENGTH;
        copy LENGTH bytes from HB[CUR-OFFSET] and
            append to HB[CUR];
    }
}
```

III. DETAILED OPERATION

A. Detailed Operation of the Data Compressor

1. General Flow

The following will describe details of the operation of the data compressor for compressing the data contained in one instance of the history buffer. It will be understood that the same method may be repeatedly performed on multiples instances of the history buffer, such as in the compression of a data file which is larger than the history buffer. The history buffer and input buffer are assumed to be filled, by conventional means, prior to invocation of the data compressor.

Figure 5:
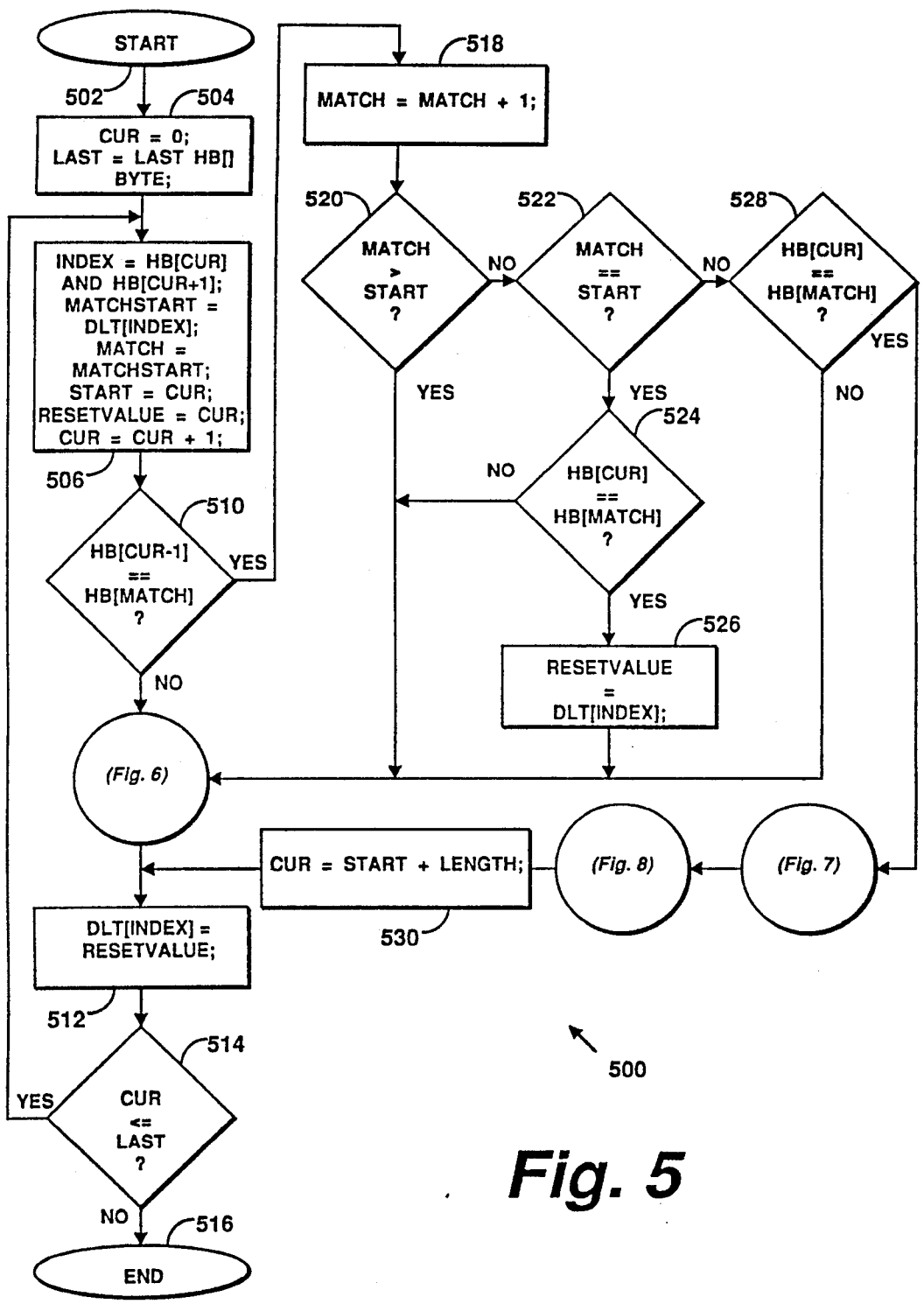
FIG. 5 is a flowchart depicting high-level operation of the data compressor of the present invention.

FIG. 5 is a flow chart 500 which describes, at a high level, the method by which the data compressor of the present invention operates. Compression of the history buffer begins at a staring point 502 immediately upon invocation of the data compressor. Compression proceeds at a block 504, which sets the index CUR to point to the beginning of the history buffer and the index LAST to point to the final valid byte in the history buffer. If the history buffer is less than full, the index LAST will point somewhere in the middle of the history buffer. Thus, the index LAST identifies the "logical" end of the history buffer, rather than the "physical" end.

Next, at block 506, the current and next bytes (HB[CUR] and HB[CUR+1]) of the history buffer are concatenated to form an INDEX into the DLT[]. The utilization of this pair of data bytes as an index is a key feature of the present invention, and is the reason for the word "Pairs" in the name of the present data compression and decompression method: "Chambers' Pairs".

One important factor in the dramatically improved speed performance of the present invention over previously-known data compressors arises from the fact that the DLT[] is addressed (indexed) directly, rather than through an intervening hash table. Another key feature of the present invention is that the DLT[] does not need t be initialized prior to its utilization. Each entry in the DLT[] is an index into the history buffer. If an uninitialized DLT entry is invalid, it will be corrected before subsequent utilization. However, if an uninitialized DLT entry happens by coincidence to be valid, the correct value need not be rewritten.

The size of the DLT[] could, in various modes, be altered to suit particular needs. For example, it may be determined that adequate history recognition may be obtained by using a DLT[] which is indexed by only a single INDEX byte, rather than the pair of INDEX bytes described above. For example, in English language text files, the letter "t" is very frequently followed by the letter "h". In this case, addressing the DLT[] by the one-byte INDEX "t" will achieve the nearly same result as indexing with the two-byte INDEX "th". Alternatively, the DLT[] could be indexed by more than two bytes. Note that the number I of INDEX bytes determines the shortest recognizable string, unless modifications are made to the way in which the data compressor updates the DLT[] when a new string is encountered.

Optimally, the DLT[] will be $2^{8 \times I}$ bytes long, so that all INDEX values are valid and so that the entire DLT[] can be accessed by the INDEX. In the example illustrated above, I is 2, and the DLT is $2^{8 \times 2}$=sixty-four kilobytes long. While using a larger DLT[] (i.e. more INDEX bytes) may provide a more unique string recognition, this will require an increased amount of memory in the data compression system. It is also possible to use more than one DLT[]. This has, however, been observed to generally be a bad trade-off, because of the additional memory required, and because of additional computational overhead required.

Next, in block 506, the present value at DLT[INDEX] is copied to an index MATCHSTART and to an index MATCH, and the present value of the index CUR is copied to an index START and to an index RESETVALUE. The index CUR is then advanced (incremented) to point to the next byte in the history buffer.

The indices MATCH and MATCHSTART are used to access previously-encountered strings in the history buffer, the indices CUR, START, and RESETVALUE are used to access newly-encountered and potentially matching strings in the history buffer, and the index LAST is used to maintain string access within the bounds of the history buffer.

From block 506, operation proceeds to decision block 510, where the data compressor tests whether the current byte (HB[CUR−1]) of the history buffer is equal to the target match byte (HB[MATCH]). Recall that the target match byte was found by using the entry at DLT[INDEX] to access the history buffer. If the current byte and target match byte are not equal, it means that the data compressor was not previously encountered a string which begins with the same byte as the current string. If the current byte and target match byte are equal, it means that the data compressor may have previously encountered a string which begins with the same byte as the current string. If the DLT[] were initialized before each use, such as being filled with zeroes or other suitable values, equality between the current byte and target match byte would mean that the data compressor has previously encountered a string which begins with the same byte as the current string. However, in the interest of speed, the DLT[] is not initialized, as explained above.

2. Literal Generation

If the current byte and target match byte are not equal, operation of the data compressor jumps to the routine shown in FIG. 6. The flowchart 600 of FIG. 6 begins at a starting point 602, from which operation proceeds to block 604, where the data compressor outputs a literal indicator. In one mode, the literal indicator is the bit 02 The literal indicator indicates that a predetermined number LITBITS of subsequent bits are to be literal data. Throughout this disclosure, the subscript$_2$ is used to denote binary numbers, and the subscript$_{16}$ is used to denote hexadecimal numbers.

From block 604, operation continues at block 606, where the data compressor outputs the predetermined number LITBITS of data bits. In one mode, the predetermined number is eight, such that a literal byte follows the literal indicator. In this mode, the data compressor then outputs the eight bits of the current byte (HB[CUR−1]) as a literal.

Thus, the first instance of a particular eight-bit byte is represented in the output buffer by nine bits. This negatively-efficient compression is typically compensated for by subsequent, very positively-efficient compressions, as will be explained below.

From block 606, operation of the data compressor passes through ending point 608 back to the point a which the literal output routine was invoked, and operation continues at block 512 of FIG. 5.

3. General Flow After Literal Generation

At block 512, the DLT[INDEX] entry is updated to point to the recently-found instance of a string beginning with the same current and next bytes (HB[CUR−1] and HB[CUR]). The update is done simply by copying the RESETVALUE pointer into DLT[INDEX], the index RESETVALUE pointing to the first byte in the newly-encountered string.

Then, operation continues at decision block 514, which tests whether the history buffer contains yet-unprocessed data. This test is performed by determining by whether the index CUR is less than or equal to the index LAST. If so, operation returns to block 506, where a new INDEX is obtained from a next pair of history buffer bytes. However, in decision block 514, if the index CUR is greater than the index LAST, compression of the contents of the history buffer is complete, and operation of the data compressor halts through ending point 516.

In decision block 510, if a match is found between the initial bytes (HB[CUR−1] and HB[MATCH]) of the current and target strings, operation proceeds to block 518, where the data compressor advances (increments) the index MATCH to point to a next byte in the target match string. The index MATCHSTART continues to point to the first byte of the target match string. From block 518, operation passes to decision block 520, where the data compressor determines whether the target string is invalid, or, in other words, whether the target string is located after the current string in the history buffer. This determination is made by simply comparing the index MATCH to the index START. If the index MATCH is greater than the index START, the target string is invalid (not yet encountered), and the current string is a first instance. This test allows the non-initialization of the DLT[].

Because the data compressor checks for byte matching before it checks for index validity (i.e., it checks whether HB[MATCH] equals HB[CUR] before it checks whether MATCH is greater than START), performance is improved. This is because there is only a one-in-two-hundred-fifty-six chance of a match upon random bytes, as opposed to a roughly one-in-two chance that the index MATCH is valid. In fact, near the start of the history buffer, there is nearly a one-in-one chance that the index MATCH will be invalid, because the majority of the history buffer lies beyond the index START. If the index MATCH is greater than the index START, operation of the data compressor passes from block 520 to the flowchart 600 of FIG. 6, as described above.

If the index MATCH is not greater than the index START, operation passes instead to block 522, where the data compressor checks whether the index MATCH is equal to the index START. If so, operation passes to decision block 524, where the data compressor determines whether the second byte (HB[CUR]) of the current string is equal to the second byte (HB[MATCH]) of the target match string. If they are not equal, operation passes to the flowchart 600 of FIG. 6, as described above. If they are equal, however, operation passes to block 526.

At block 526, the data compressor copies the value from DLT[INDEX] to the index RESETVALUE. This operation is an optional optimization of the method, and is not strictly required in all modes of the invention. The operation of block 526 is useful when the history buffer contains a string of identical characters, such as the sixteen-byte string "XXXXXXXXXXXXXXXX". In this example, it is desirable that the data compressor not merely recognize eight instances of the string "XX". Optimally, the data compressor should output the first two "X" bytes as literals, then recognize that the third and fourth "X" bytes are a string which matches the string comprising the first and second "X" bytes, then recognize that the fifth through eighth "X" bytes are a string matching the first through fourth "X" bytes, and finally recognize that the ninth through sixteenth "X" bytes match the first through eighth "X" bytes. Block 526 moves the index RESETVALUE back from the start of the current string to the start of the target match string. This ensures that a subsequent string will be matched against the longest possible portion of the given target match string.

From block 526, operation then passes to the flowchart 600 of FIG. 6, as described above.

At decision block 522, if the index MATCH is not equal to the index START, operation passes to the decision block 528, where the data compressor checks whether the second byte (HB[CUR]) of the current string matches the second byte (HB[MATCH]) of the target match string. If not, operation passes to the flowchart 600 of FIG. 6 as described above. This condition minimizes any negatively-efficient effects of the data compression method. A matching string of length one will be output as a literal, with an attendant penalty of only one bit (the literal indicator), rather than with a somewhat larger penalty incurred in outputting non-literal data, as will be explained below.

Figure 7:
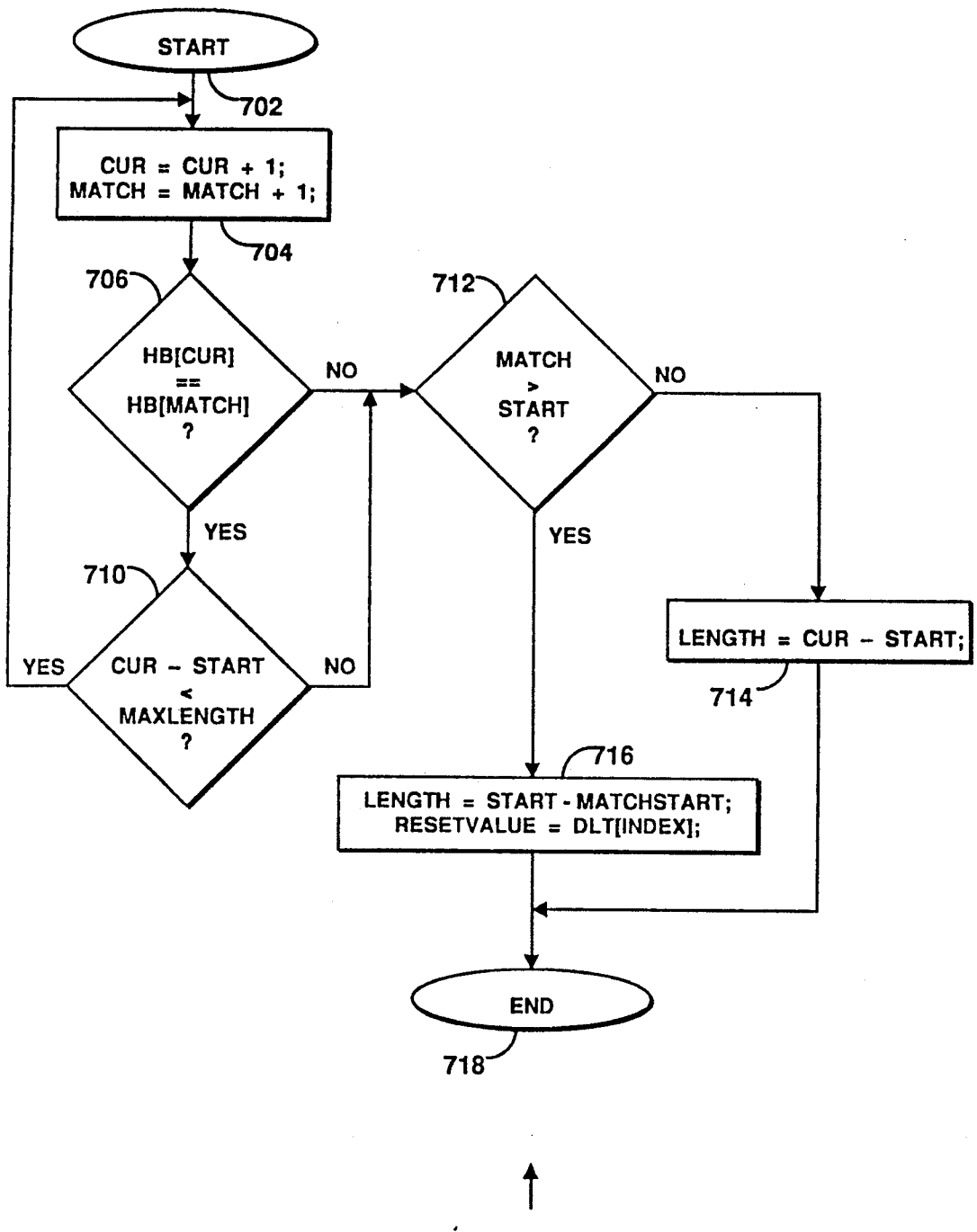
FIG. 7 is a flowchart depicting operation of the data compressor to determine string matching.

If, in decision block 528, the data compressor determines that the second bytes of the current and target strings match, operation passes to the flowchart 700 of FIG. 7 for further string matching. Thus, the string matching functions performed by elements 520, 522, 524, 526, and 528 of FIG. 5 determine whether there is valid prior matching string of length two or greater. The string matching functions of FIG. 7 determine what the actual length of the matching string is to be.

4. Matching String Length Determination

In FIG. 7, the string matching operations pass from a starting point 702 to block 704, where the data compressor advances (increments) the index CUR and the index MATCH to the next (third) bytes in the current and target strings, respectively.

From block 704, operation continues at decision block 706, which checks whether the third bytes in the current and target strings match (i.e. whether HB[CUR] matches HB[MATCH]). If so, operation passes to decision block 710, which checks whether the string which has been matched thus far is within a predetermined length MAXLENGTH, as indicated by the difference between the index CUR and the index START. If so, operation returns to block 704 to check a next (fourth etc.) byte in the current and target strings.

The MAXLENGTH checking in decision block 710 will prevent string matching to extend more than about MAXLENGTH bytes beyond the end of the history buffer. Otherwise, the computer system's memory might coincidentally contain data forming matching strings which extend far beyond the history buffer, such as when the remainder of memory is full of $00_{16}$ bytes.

The value of MAXLENGTH is selected according to the trade-offs detailed above, to be long enough to allow recognition of frequently-found matching string lengths, yet short enough to minimize the penalty associated with unused -bits in the string length identifier, which will be explained below.

The value chosen for MAXLENGTH will impact the efficiency of the data compressor in two ways. First, if too long a MAXLENGTH is selected, the non-literal output penalty will be excessive most of the time, as will be understood below with reference to the calculating and outputting of length indicators. Second, if too short a MAXLENGTH is selected, the data compressor will not make maximal recognition of duplicate copies of long strings. This will result in the addition to the output buffer of extra codes required to indicate additional matching strings. For example, if the history buffer includes two instances of the word "software", and the selected MAXLENGTH is four, when the data compressor encounters the second instance of the word "software", the data compressor will recognize a second instance of the word "soft" and a second instance of the word "ware", rather than simply a second instance of the word "software". The penalty associated with outputting a non-literal must then be paid twice, both in the form of decreased compression speed and in the form of decreased compression ratio.

If the test of either decision block 706 or decision block 710 is failed (i.e. has a false result), operation passes to decision block 712. Decision block 712 tests for overlapping of the target and current strings, by checking whether the index MATCH is greater than the index START.

The condition known as "overlapping" is occasionally encountered in data, and occurs when an initial portion of a string is repeated later in the same string. For example, when the string "123123124" is encountered, the data compressor will place an index to the beginning of that string at the DLT[] entry indexed by "12". Then, when the second instance of "12" is encountered, a string match will be identified. The second instance of "123" matches the first instance of "123". This is fine and allowable. However, an overlap exists in that the second instance "12312" matches the first instance of "12312", with the second instance of "12" being in both the target and the source strings. This has been observed to reduce decompression speed, and is therefore disallowed in one mode of the present invention. When the present invention encounters such a string, the identified string length would be three. In other words, the match is limited to "123" matching "123". While improved compression ratios may be achieved by allowing overlapping, it has been observed to a bad trade-off in that an unacceptably increased amount of processing must be performed during decompression.

If overlapping is not detected in decision block 712, operation passes to block 714. At block 714, the data compressor defines the length of the matched string by setting LENGTH equal to the difference between the index CUR (which has by then advanced one byte beyond the matching string) and the index START.

If overlapping is detected in decision block 712, operation passes instead to block 716. At block 716, the data compressor defines LENGTH such that the matching target string does not overlap the current string, by setting LENGTH equal to the difference between the index START and the index MATCHSTART. Thus, the target string extends up to, but does not overlap, the current string. Also at block 716, the data compressor copies the value from DLT[INDEX] into the index RESETVALUE. This, in effect, moves RESETVALUE back to the start of the matching target string. Moving the index RESETVALUE prevents the "inchworm" effect which would otherwise be seen when a repetitive string is encountered. Without this optimization, the string "XYZXYZXYZXYZ" would be seen as four instances of "XYZ", rather than two instances of "XYZ" followed by a second instance of "XYZXYZ". The same effect occurs with a repetitive string such as "XXXXXXXX". As will be understood below with reference to the discussion of vectors, the optimization of moving back the index RESETVALUE minimizes the number of vectors which are included in the compressed data file.

From either block 714 or block 716, operation passes through ending point 718 back to the point in FIG. 5 at which the function of flowchart 700 was invoked. In one mode, after the LENGTH of the matching string has been found, operation of the data compressor passes immediately to the flowchart 800 of FIG. 8, as seen from FIG. 5.

5. Vector Generation

The function of flowchart 800 outputs a "vector". A vector is a non-literal, and, as such, does not contain literal data. Rather, a vector is an indirect reference to literal data.

Operation of the flowchart 800 passes from starting point 802 to block 804, where the data compressor outputs a vector indicator. The vector indicator functions much like the literal indicator described above, as its purpose is to indicate that some determinable number of subsequent bits are a vector rather than a literal. In the mode in which the literal indicator is the bit $0_2$, the vector indicator is the bit $1_2$.

Operation then passes to block 806, which calculates an offset (distance) from the second occurrence of the string back to the first occurrence (i.e., the difference between START and MATCHSTART). It has been observed that an improved compression ratio may be achieved with minimal additional computational overhead, by utilizing alternative-length offsets. It has been observed that alternative-length offsets are a good compromise between a single, fixed-length offset (which allows maximum compression and decompression speed), and variable-length offsets (which maximize the compression ratio). This feature is, as will be understood, optional within the bounds of the Chambers' Pairs data compression and decompression methodology.

From block 806, operation of the data compressor continues at decision block 808, which checks whether the offset from the matched (current) string to the previous instance (match target) of the same string is representable in a predetermined number SHORTOFFSETSIZE of offset bits. This is done by comparing the offset to the largest number MAXSHORTOFFSET that SHORTOFFSETSIZE bits can hold. If the offset is representable in SHORTOFFSETSIZE bits, then operation passes to block 810.

At block 810, the data compressor outputs a short offset indicator which indicates that the subsequent SHORTOFFSETSIZE bits are an offset. In one mode, the short offset indicator is the bit $0_2$. From block 810, operation passes to block 812, where the data compressor outputs the actual small offset, represented in exactly SHORTOFFSETSIZE bits.

If, at decision block 808, the data compressor determines that the offset from the start of the current string to the start of the previous instance thereof is greater than MAXSHORTOFFSET, the data compressor must output a somewhat more costly long offset. In that case, operation passes to block 814, where the data compressor outputs a long offset indicator. In the mode where the short offset indicator is the bit $0_2$, the long offset indicator is the bit $1_2$.

From block 814, operation continues at block 816, where the data compressor outputs the offset in exactly a predetermined number LONGOFFSETSIZE of bits. In one mode, SHORTOFFSETSIZE is eight bits, and LONGOFFSETSIZE is twelve bits. It will be understood that, in one mode, the history buffer may be approximately $2^{LONGOFFSETSIZE}$ bytes long, such that a string near the end of the history buffer may be matched against a string near the beginning of the history buffer. If LONGOFFSETSIZE is too large, excess unused bits will be required in each long offset, increasing the vector penalty and decreasing the compression ratio. If LONGOFFSETSIZE is too small, however, an unnecessarily large number of second instances of strings will be output as literals simply because they could not be vectored far enough back, increasing the literal penalty and again decreasing the compression ratio.

From block 812 or block 816, after the offset portion of the vector has been output, operation continues at decision block 818 for outputting of the length portion of the vector. In one mode, the length is outputted according to an observed weighted-average methodology using a variable number of length indicator bits. By representing more-commonly-encountered string lengths in a minimized number of length indicator bits, and by representing less-commonly-encountered string lengths in somewhat less minimized numbers of length indicator bits, the overall average length indicator bit penalty is minimized. It has been observed that, over a broad average of data file types, the most commonly-encountered matching string length is two (excepting length one, of course, which is disallowed), and that the second most commonly-encountered matching string length is the combined group of all string lengths greater than four. The lengths three and four are observed to occur somewhat less frequently than either length two or length greater than four.

The decision block 818 tests whether the LENGTH calculated by the flowchart 700 (of FIG. 7) equals two. If so, operation proceeds at block 820, where the data compressor outputs a length-two indicator. According to the observations described above, the length-two indicator is the bit $0_2$, which has an absolutely minimized length of one bit. If, at decision block 818, the LENGTH is determined not to be two, operation proceeds at decision block 822, where the data compressor checks whether the LENGTH equals three. If so, operation passes to block 824, where the data compressor outputs a length-three indicator. In one mode, the length-three indicator is the bits $100_2$.

If, at decision block 822, the LENGTH is determined not to equal three, operation passes to decision block 824, which checks whether the LENGTH is four. If so, operation passes to block 828, where the data compressor outputs a length-four indicator. In one mode, the length-four indicator is the bits $101_2$.

Otherwise, the LENGTH is known to be greater than four. Operation will, in that case, pass to the block 830, where the data compressor outputs a length-greater-than-four indicator. In one mode, the length-greater-than-four indicator is the bits $11_2$. From block 830, operation passes to block 832, where the data compressor outputs a length specifier which indicates how much greater than four the actual LENGTH is.

The number of bits in the length specifier bears a relationship to the maximum matchable string length and to the number of special case lengths (i.e. LENGTH equals two, three, four) utilized. In one mode, the length specifier is four bits long, and thus can represent lengths from five (the bits $0000_2$ are added to five, which is the next number after the special case lengths) to twenty (the bits $1111_2$ are added to five), inclusive.

From blocks 820, 824, 828, or 832, operation proceeds to the ending point 834 of the flowchart 800. The vector is then complete, and operation returns to the block 530 of FIG. 5, which immediately follows the point at which the flowchart 800 of FIG. 8 was invoked.

6. General Operation After Vector Generation

In block 530, the data compressor advances the index CUR just beyond the recently matched string, by setting it LENGTH bytes beyond the index START. From block 530, operation passes to the block 512, where operations proceed as described above.

Figure 8:
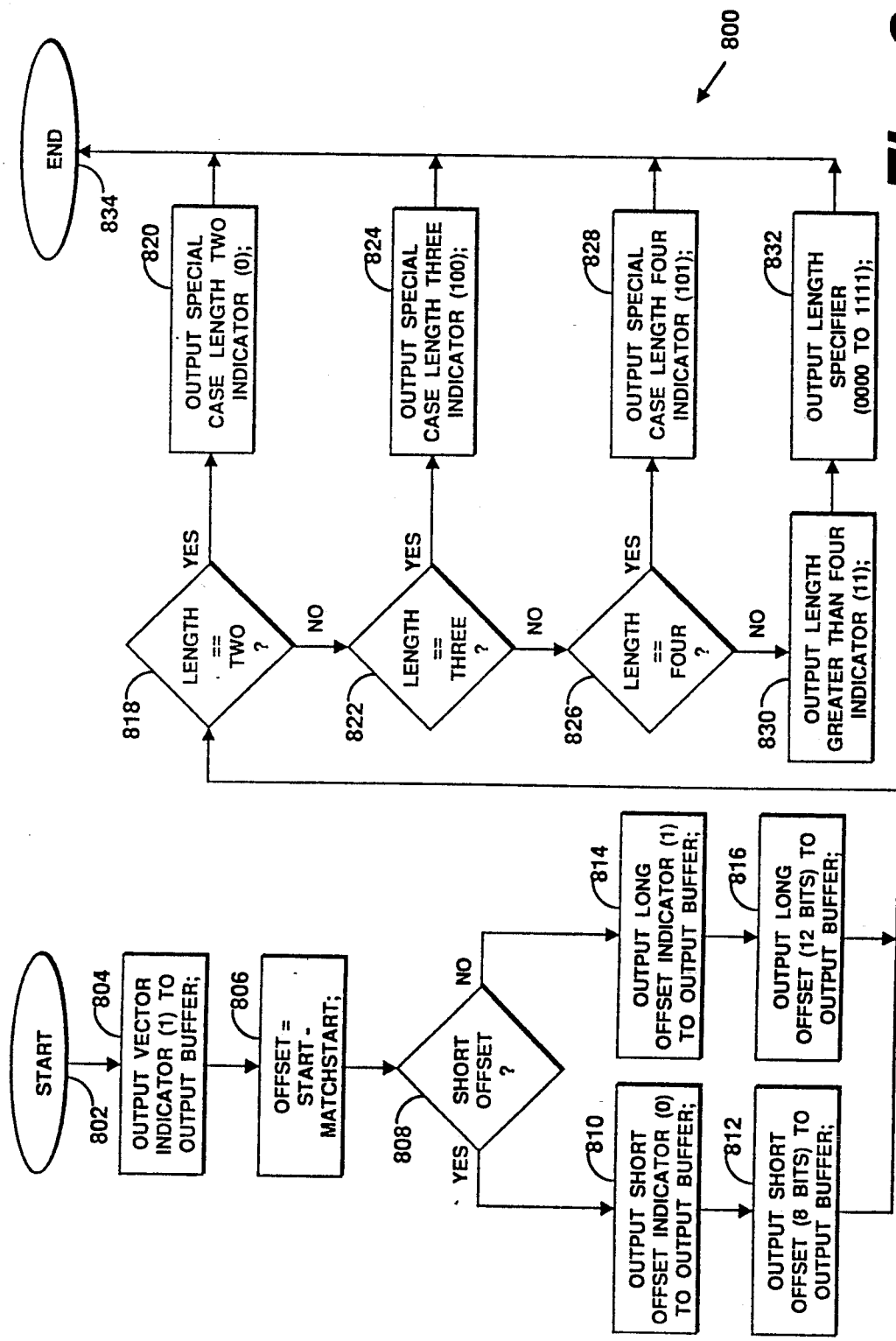
FIG. 8 is a flowchart depicting operation of the data compressor to output a vector.

It will be understood that the special case lengths may be checked for in any order, and not just in the numerical order shown in FIG. 8. For example, it may prove advantageous to first check for length-greater-than-four. Factors to be weighed in selecting an order include the relative frequencies of the various cases, and the computational penalty associated with each respective check.

It will be further understood that the Chambers' Pairs method may be practiced without utilizing special case lengths, and without using alternative-length offsets. These features are improvements over the bare-bones method, and are seen to be advantageous in practice. The number and identity of special case lengths may be varied as suits particular compression needs, as may the number and identity of alternative-length offsets. For example, one may encounter a data file type which compresses faster and smaller if more and longer special case lengths are used, or another data file type which compresses faster and smaller using only short offsets and using only a single valid string length of eight bytes.

Variable-length offsets may also be employed, but their use has been shown in practice to be a bad trade-off. Although variable-length offsets may actually reduce the size of the output buffer, or in other words, improve the compression ratio, their utilization involves such a greater degree of complexity in the compression and decompression routines that the increase in compression ratio is deemed not to be worth the decrease in compression speed and decompression speed.

Other operations are performed by the data compressor, for each instance of the history buffer. For example, although the Chambers' Pairs method does not require dictionaries to be embedded in the compressed data file, it may advantageously operate in a mode in which block headers are embedded in the compressed data file, one for each instance of the output buffer. The block header may, for example, include an identification of the size of the history buffer used, to ensure that the data compressor and the data decompressor cooperate properly. However, if a fixed size is always used, this information may be assumed, rather than specified in a block header. The history buffer size does, however, prove useful at the final block of a compressed data file, which will nearly always occupy somewhat less than a full history buffer (i.e., when the logical and physical end-of-file do not coincide). Alternatively, a global header may be used for the entire compressed data file, rather than a separate block header for each block. In one mode, the compressed data file's global header includes information relevant to reconstructing various operating system aspects of the non-compressed data file according to the host computer's operating system. In one mode, the invention is practiced on an Apple Macintosh computer. Apple and Macintosh are trademarks of Apple Computer, Inc., of Cupertino, Calif. When practiced on a Macintosh, the global file header may accordingly include information for reconstructing the decompressed file's correct "type" and "creator", and the like.

Other information which may be embedded in the block header includes an indication of whether the block contains compressed data or copied data. On occasion, the data compressor will encounter a history buffer containing incompressible data. Incompressible data actually expands upon attempted compression, or, in other words, has a compression ratio of less than 1:1. For example, a two-hundred-fifty-six-byte file containing unique ASCII characters in random order is generally incompressible, as there will never be a repeated string, even of length one. Attempted compression of such a file would result in the outputting of two hundred fifty-six literals, with the one-bit literal indicator penalty being paid once for each byte in the file.

The data compressor may operate in a "smart mode", in which it detects whether an incompressible block of data has been encountered. Upon encountering an incompressible data block, the data compressor simply copies the content of the history buffer to the output buffer, with an indication of such being made in the block header. A given "compressed" data file may include both compressed and copied data blocks. The data compressor is able to achieve a maximal compression ratio by compressing only those blocks which are compressible at a greater than 1:1 ratio.

In one mode, the block header also includes a number COMPSIZE identifying the compacted size of the block, a number EXPSIZE indicating the expanded size of the block, a checksum EXPDCHKSUM which is generated over the non-compressed data before compression, a checksum COMPDCHECKSUM generated over the compressed data, and a checksum HCHKSUM which is generated over the header. In one mode, the compressed data is padded as required, to permit easy addressing of the blocks by ensuring that each block begins on a given byte boundary. On the Macintosh host computer, it is desirable to pad the compressed data block out to a multiple of four bytes. Thus, the block header further contains a PAD identifier which indicates the number of padding bytes used.

In the mode described above, the data compressor requires no more than one hundred twenty-eight kilobytes memory for the DLT[] (sixty-four kiloentries at two bytes each). In an absolute minimum configuration, the data compressor need not have input nor output buffers, and even the history buffer may be omitted, albeit at a great performance penalty owing to repeated direct accessing of the data file. In one mode of configuration, the data compressor includes the one-hundred-twenty-eight-kilobyte DLT[] and a four-kilobyte history buffer. In one mode of configuration, the data compressor further includes an input buffer and an output buffer whose sizes are dynamically determined at run-time according to an available quantity of memory in the computer system. The input and output buffers may be up to two hundred fifty-six kilobytes each, for example. Because it is expected that most data will compress a ratio of approximately 2:1, the output buffer may be dynamically allocated to be only half as large as the input buffer. Other input and output buffer allocation factors may depend upon the specific aspects of the computer system's I/O system, such as bus bandwidth, DMA capabilities, and the like, for example.

B. Detailed Operation of the Data Decompressor

Figure 9:
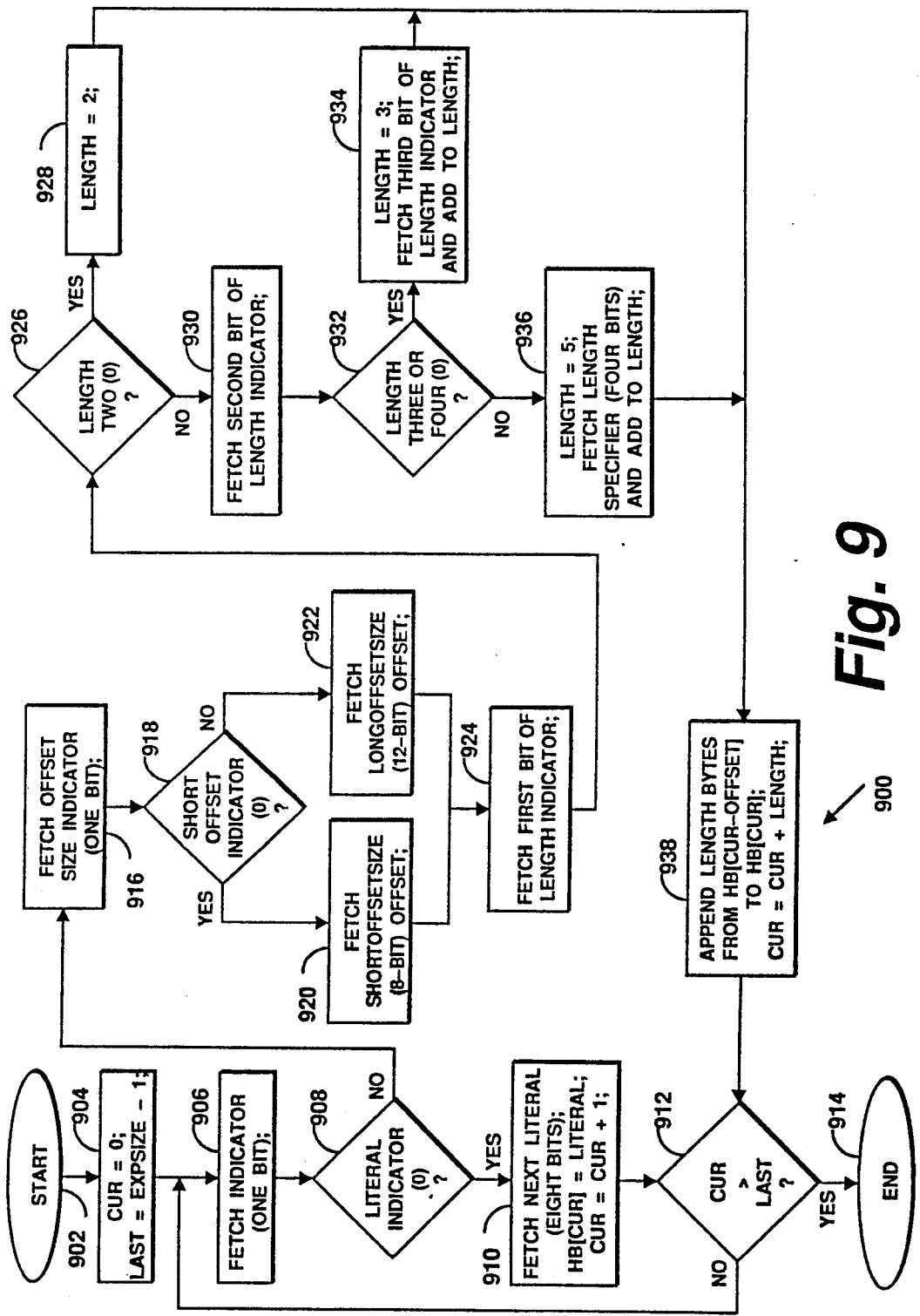
FIG. 9 is flowchart depicting operation of the data decompressor of the present invention.

FIG. 9 is a flowchart 900 illustrating operation of the data decompressor of the present invention. The decompressor logically operates upon a compressed data file, but may more advantageously operate upon an input buffer into which the compressed data file is loaded, either in whole or as a series of blocks. The data decompressor of the present invention is a very fast state machine, as will be understood from the following description.

Operation of the data decompressor passes from a starting point 902 to a block 904, which sets the index CUR to the beginning of the history buffer. In one mode, the index CUR is thus set to zero. The block 904 also sets the index LAST to the history buffer location into which the last decompressed byte will be outputted (i.e. to the logical end of the history buffer). In one mode, the index LAST is set according to the number EXPSIZE obtained from the block header. FIG. 9 does not show the conventional copying operations performed upon copied data blocks, only the decompression operations performed upon compressed data blocks. FIG. 9 further does not show the checksum operations which ensure that no data corruption has occurred.

From block 904, operation of the data decompressor proceeds to a block 906, which fetches an indicator (the next bit) from the input buffer. Owing to the particular state machine design of the data decompressor, each bit which the block 906 fetches will be either a literal indicator or a vector indicator.

From block 906, operation passes to decision block 908, which determines whether the bit fetched by the block 1006 is a literal indicator ($0_2$) If so, operation passes to block 910, which copies the literal (i.e. the next eight bits) from the input buffer to the history buffer, writing the literal to the location HB[CUR]. At block 910, the data decompressor also advances the index CUR to the next byte in the history buffer, such as by incrementing the index CUR.

From block 910, operation passes to decision block 912, where the data decompressor checks whether the index CUR is greater than the index LAST. If the index CUR is not greater than the index LAST, decompression is not yet complete, and operation passes back to block 906 to fetch the next indicator bit.

At decision block 912, if the index CUR is greater than the index LAST, it means that the history buffer is (logically) full and decompression is complete, so operation passes to end point 1014. If the compressed data file for the input was formed by the compression of a plurality of instances of the history buffer, or in other words, the non-compressed data file was larger than the history buffer, the decompressor will be repeatedly invoked the same number of times as the data compressor was invoked. Each invocation of the data decompressor reconstitutes one instance of the history buffer, just as one invocation of the data compressor compressed one instance of the history buffer.

At decision block 908, if the indicator bit fetched at block 906 is not a literal indicator, it is a vector indicator (i.e. $1_2$) instead. In this case, operation passes from decision block 908 to block 916, to fetch a one-bit offset size indicator. From there, operation passes to decision block 918 which checks whether the bit indicates a short offset (i.e. whether the bit is $0_2$). If so, operation passes to block 920, which fetches the next SHORTOFFSETSIZE bits from the input buffer. If the offset length indicator fetched by block 916 is determined by decision block 918 to be a long offset indicator (i.e. $1_2$), operation passes from decision block 918 to block 922. At block 922, the data decompressor fetches the next LONGOFFSETSIZE bits from the input buffer. The vector's offset is then retrieved and known, and operation continues for the retrieval of the vectored string's length.

From either block 920 or block 922, operation continues at block 924, which begins the weighted-average state machine operations of checking for special case string lengths, by fetching the next bit from the input buffer. From block 924, operation passes to decision block 926, which checks whether the bit equals $0_2$, which would identify the special case length of two. If the bit is $0_2$, operation passes to block 928, which sets the LENGTH to two.

At decision block 926, if the bit was not equal to $0_2$, it means that the special case length of two was not indicated. In that case, operation passes from decision block 926 to block 930 to fetch another bit in the special case length identifier. From block 930, operation passes to decision block 932, which checks whether the new bit equals $0_2$. If so, the bit indicates the special case lengths of three and four. In this case, operation passes to block 934, which sets the LENGTH equal to three and fetches a next bit from the input buffer. This next bit distinguishes between the special case lengths of three and four. If it is $0_2$, the length is three, and if it is $1_2$, the length is four. The block 934 adjusts the LENGTH accordingly. In one mode, the distinguishing bit is simply added to LENGTH.

At decision block 932, if the bit fetched by block 930 is not $0_2$, it is known that the vector string length is greater than four. In this case, operation passes to block 936, which fetches the next four bits from the input buffer. These next four bits are added to five and the result is stored in LENGTH. Thus, LENGTH will be in the range of five to twenty, inclusive.

From blocks 928, 934, or 936, operation passes to block 938, which performs the key decompression function. Because a vector, rather than a literal, has been encountered, the already-decompressed portion of the history buffer contains a string which is to be duplicated and appended to the present end of the valid content of the history buffer. The string beginning at the specified offset from the present location in the history buffer (HB[CUR-OFFSET]), and extending for LENGTH bytes, is copied from the previous portion of the history buffer to the present end of the decompressed portion of the history buffer, beginning at HB[CUR]. In one mode, block 938 simply copies MAXLENGTH (i.e. twenty) bytes beginning at HB[CUR-OFFSET] to locations beginning at HB[CUR]. This avoids looping, testing, and conditional branching in the decompressor to improve its performance. Any excess bytes which are copied, beyond the true LENGTH of the duplicate string, will be subsequently overwritten because the LENGTH variable controls how far the index CUR is advanced. Thus, the index CUR will frequently advance to a point somewhere in the middle of the copied twenty-byte string.

The value of MAXLENGTH may also be chosen to suit certain features of the host architecture. In the mode in which the invention is practiced on an Apple Macintosh computer, which includes a Motorola 68020, 68030, or 68040 microprocessor, four bytes may be moved in a single machine instruction referred to by the assembly instruction MOVE.L. In this mode, MAXLENGTH may therefore most advantageously be a multiple of four, such as twenty. MAXLENGTH may be adjusted to take similar advantage of whatever host platform is chosen.

Along these same lines, further looping, testing, and conditional branching are avoided by allowing string copying to somewhat overrun the end of the history buffer. For example, if decompression has advanced up to a point two bytes from the end of the history buffer, and a vector is identified, twenty bytes will be copied, overrunning the end of the history buffer by eighteen bytes. Reserving an unused piece of memory immediately following the history buffer allows the decompressor to ignore whether the end of the history buffer is being overrun, while preserving other data structures.

Block 938 then increments the index CUR by the value of LENGTH, to advance the index CUR past the newly-copied string. From block 938, operation proceeds to decision block 912, to continue decompression as described above.

A further feature of the present invention is that the decompressor is "self-recovering". If the compressed data file becomes corrupted, upon decompression, the decompressor will most likely not "crash". If the corruption occurs in the data bits of a literal, the literal will simply come out wrong. If corruption occurs in bits identifying an offset, a wrong second instance of a string will be generated. If corruption occurs in bits identifying a length, the second instance will simply have too few or too many characters in it. In any of those cases, the data decompressor will recover immediately upon operation passing to block 906, because errors caused by corruption of those bits only affects the data decompressor's output machine, and not its state machine.

Other errors will not be immediately recoverable, such as errors caused by corruption of the literal/vector indicators, offset length indicators, special case string length indicators, because corruption of those bits will cause the data decompressor's state machine to make mistaken interpretation of (perhaps all) subsequent bits in the block.

Even if things go drastically awry in a block, at the end of the block, the decompressor starts over (in a recovered state) at each new block. Therefore, the decompressor is self-recovering at two levels.

Each block header contains a checksum generated over the compressed data portion of the block, and another checksum generated over the block header itself. In one mode, each checksum is simply a one-byte value generated by the data compressor as a bitwise exclusive-or (XOR). Although such checksums do not provide absolutely fail-safe error detection, they do provide a sufficient decrease in the odds of harmful data corruption. They do not, however, provide a means for error correction. Error correcting codes could be included in the block headers, but their generation involves a large performance penalty. The performance of error correction routines to de-corrupt data involves an even greater performance penalty.

As a compromise, each block header could include a checksum generated over the original, non-compressed data. Such a checksum, while still not allowing error correction, would provide yet another level of error detection at a minimal performance penalty. In this mode, the data decompressor would generate a checksum over the ultimate content of the history buffer, and then compare this generated checksum to the non-compressed data checksum from the block header.

Other modes of error detection are possible, such as cyclic redundancy codes and the like, but the checksum method involves the least performance penalty.

Additionally, the data decompressor of the present invention is, unlike previously-known decompressors, not subject to "data explosion". Two features of the data decompressor prevent data explosion. First, at each string matching operation, the data decompressor checks whether the string is MAXLENGTH bytes long. This prevents runaway string matching. Second, after each string or literal is output, the data decompressor checks whether the end of the history buffer has been reached. This prevents runaway output.

In the mode described above, the actual code of the decompressor requires less than two hundred fifty-six bytes of memory, and fits within many computers' onboard CPU instruction caches, enabling the data decompressor to operate at optimal speed. In an absolutely minimized configuration, the data decompressor would not require any memory in the host computer, because the method could be performed directly on the individual blocks of the compressed data file, and the output could be sent directly to the decompressed data file. This would, of course, involve a substantial performance penalty. In one mode of configuration, the data decompressor includes a four-kilobyte history buffer plus at least MAXLENGTH unused bytes for overrun. In one mode of configuration, the data decompressor further includes dynamically allocated input and output buffers similar to those of the data compressor, except that the output buffer may be approximately twice as large as the input buffer, owing to the expected average decompression ratio of 1:2.

IV. COMPRESSION EXAMPLES

The following are examples of data compression according to the method of the present invention. The examples are chosen to contain primarily alphabetic characters, generally forming English words. It will be understood that these heuristic examples are chosen for their simplicity, and that the invention may be used in compressing data of any content whatsoever.

The examples include compressed (output) data in symbolic form, which is for heuristic purposes only, and which is not actually part of the compressed data output by the present invention. The actual compressed data output is indicated as such. In the symbolic compressed data, literal and vector indicators are omitted, as are offset length indicators and special case length indicators. Literal data are shown as regular characters, while vectors are shown in brackets. For example, the notation [−6,3] would indicate a vector with an offset of six (minus six added to the current location) and a length of three. In the actual compressed data, the output is shown as grouped in two-byte integers, with any remainder shown as appropriate. Please ignore any apparent carriage returns in the examples, and any spaces in the symbolic and actual compressed data.

The following examples may also be understood to be example of decompression. When the given actual compressed data are provided as input to the data decompressor of the present invention, the given non-compressed data will result.

A. First Example—Repetitive String

The first example, shown in Table 3, includes thirty-two instances of the string "ABC". Note that the first three bytes are output as literals, and that the first vector has a length of three. Then, the second vector has a length of six, showing that it is a duplication of the former literals and the output symbolized by the previous vector, as explained above regarding overlapping strings. Finally, note that although the length would theoretically proceed from six to twelve to twenty-four and so on, the MAXLENGTH of twenty is imposed.

TABLE 3

| Non-Compressed Data: |
|---|
| ABCABCABCABCABCABCABCABCABCABCABCABCABC |
| ABCABCABCABCABCABCABCABCABCABCABCABCABC |
| Symbolic Compressed Data: |
| ABC [−3,3] [−6,6] [−12,12] [−24,20] [−42,20] |
| [−63,20] [−60,12] |
| Actual Compressed Data: |
| $2090_{16}$ $8870_{16}$ $1C81_{16}$ $B183_{16}$ $3786_{16}$ $3F8A_{16}$ $BF8F_{16}$ |
| $FF8F_{16}$ $37_{16}$ |

B. Second Example—Repetitive String

The second example, shown in Table 4, includes two hundred forty-nine A's. Note that the symbolic compressed data includes two literal A's, followed only by a series of vectors.

TABLE 4

| Non-Compressed Data |
|---|
| AAAAAAAAAAAAAAAAAAAAAAAAAAAAAAAA |
| AAAAAAAAAAAAAAAAAAAAAAAAAAAAAAAA |
| AAAAAAAAAAAAAAAAAAAAAAAAAAAAAAAA |
| AAAAAAAAAAAAAAAAAAAAAAAAAAAAAAAA |
| AAAAAAAAAAAAAAAAAAAAAAAAAAAAAAAA |
| AAAAAAAAAAAAAAAAAAAAAAAAAAAAAAAA |
| AAAAAAAAAAAAAAAAAAAAAAAAAAAAAAAA |
| AAAAAAAAAAAAAAAAAAAAA |
| Symbolic Compressed Data |
| AA [−2,2] [−4,4] [−8,8] [−16,16] [−32,20] |
| [−20,20] [−20,20] [−20,20] [−20,20] |
| [−20,20] [−20,20] [−20,20] [−20,17] |
| Actual Compressed Data |
| $2090_{16}$ $6024_{16}$ $0960_{16}$ $8CE1_{16}$ $0EE2_{16}$ $0FE1_{16}$ $4FE1_{16}$ |
| $4FE1_{16}$ $4FE1_{16}$ $4FE1_{16}$ $4FE1_{16}$ $4FE1_{16}$ $4FE1_{16}$ $4FE1_{16}$ |
| $4FE1_{16}$ $4F00_{16}$ |

C. Third Example—English String

The third example, shown in Table 5, illustrates a more typical compression, in which a mixture of literals and vectors is generated. Note that the second A is in two overlapping vectored-to strings. The first vector refers back to the first instance of AN, while the last vector refers back to the first instance of GA; the AN and the GA contain the same A. This is not an overlapping problem such as is discussed above, as it is not an overlap between a previous and a current string.

TABLE 5

| Non-Compressed Data |
|---|
| ABUGANDANANTSANGANTHEMS. |
| Symbolic Compressed Data |
| ABUGAND [−3,2] [−2,2] TS [−4,2] [−12,3] THEMS. |
| Actual Compressed Data |
| $2090_{16}$ $8AA4_{16}$ $7209_{16}$ $3889_{16}$ $01A0_{16}$ $2150_{16}$ $A702_{16}$ $20C8_{16}$ $5424_{16}$ $1149_{16}$ $A531_{16}$ $70_{16}$ |

D. Fourth Example—English String

The fourth example, shown in Table 6, illustrates another typical compression, including a mixture of literals and vectors.

TABLE 6

| Non-Compressed Data |
|---|
| THE_CAT_SAT_IN_A_SATIN_HAT_THAT_A_MAN_CANNOT_WEAR. |
| Symbolic Compressed Data |
| THE_CAT_S [−4,3] IN_A [−9,4] [−8,3] H [−15,3] [−27,2] [−5,3] [−17,2] MA [−23,2] [−34,2] NNO [−37,2] WEAR. |
| Actual Compressed Data |
| $2A12_{16}$ $08A5_{16}$ $F219_{16}$ $04A8_{16}$ $5F29_{16}$ $C090_{16}$ $924E_{16}$ $2F90_{16}$ $609B_{16}$ $0442_{16}$ $441F_{16}$ $21B4_{16}$ $0B21_{16}$ $1134_{16}$ $830B_{16}$ $A221_{16}$ $389C_{16}$ $4F89_{16}$ $4572_{16}$ $2904_{16}$ $A42E_{16}$ |

E. Fifth Example—Non-Compressible String

The fifth example, shown in Table 7, illustrates a non-compressible string. There are two types of incompressible strings. The more obvious type is those which do not contain any repeated strings of length two or more. Upon attempted compression, such strings will yield a 9/8 size increase owing to the literal indicator penalty. The less obvious type is those which, although containing vectorable strings, do not contain enough to compensate for the literal penalty. The fifth example is of the more obvious type. Note, therefore, that the symbolic compressed data is identical to the non-compressed data.

TABLE 7

| Non-Compressed Data |
|---|
| A_QUICK_BROWN_FOX_JUMPS_OVER_THE_LAZY_DOG. |
| Symbolic Compressed Data |
| A_QUICK_BROWN_FOX_JUMPS_OVER_THE_LAZY_DOG. |
| Actual Compressed Data |
| $2097_{16}$ $CA25_{16}$ $5249_{16}$ $0C96_{16}$ $5F21_{16}$ $1489_{16}$ $E572_{16}$ $717C_{16}$ $8C4F_{16}$ $2C17_{16}$ $C945_{16}$ $5269_{16}$ $40A6_{16}$ $5F27_{16}$ $9588_{16}$ $A522_{16}$ $F950_{16}$ $9045_{16}$ $2F93_{16}$ $0825_{16}$ $A2C9_{16}$ $7C88_{16}$ $4F23_{16}$ $8B80_{16}$ |

V. DATA FILE PRE-PROCESSING

The present invention may advantageously be employed in conjunction with a variety of other, known compression techniques, which may be used as "pre-filters" for preparing the data before compression by the Chambers' Pairs method. One pre-processing technique which has been observed to be advantageous is the D (Delta) technique. The D technique operates upon sequential bytes. A D1 pre-processing outputs the first byte, subtracts the first byte from the second byte and outputs the result, subtracts the second byte from the third byte and outputs the result, and so forth. A D2 technique operates upon alternating bytes, and a D3 technique operates upon every third byte, and so forth. The D3 technique is useful, for example, in pre-processing RGB color graphics files, in which the first byte of every three represents a red value, the second byte a green value, and the third byte a blue value.

Consider the D1 technique operating upon a data block containing the two hundred fifty-six unique ASCII bytes in numerical order. The D1 technique outputs the first byte ($00_{16}$). It subtracts the first byte ($00_{16}$) from the second byte ($01_{16}$) and outputs the difference ($01_{16}$). It then subtracts the second byte ($01_{16}$) from the third byte ($02_{16}$) and outputs the difference ($01_{16}$). Thus, the D1 technique converts the contents of the file to one $00_{16}$ byte and two hundred fifty-five $01_{16}$ bytes. It will be understood that a subsequent Chambers' Pairs compression will achieve a very high compression ratio upon this pre-processed block, in the range of approximately 10:1.

Other techniques are also usable in conjunction with the present invention. Consider, for example, a data file containing the two hundred fifty-six ASCII characters in numerical order. Although this file would not otherwise be compressible by Chambers' Pairs, Lempel-Ziv, Run Length Encoding, and the like, the strictly linear pattern renders the file easily and dramatically compressible by the following technique. The pre-processing involves replacing the file with a header which includes a special flag for indicating the particular technique used, a starting value, and a length. The particular file in question may be replaced by a one-byte flag indicating "add-one-each-byte technique", the one-byte starting ASCII value $00_{16}$, and the one-byte length $FF_{16}$ of the D'ed string. Thus, this pre-processing technique yields a compression ratio of better than 85:1.

Other pre-processing functions are useful with specific data file types. Consider, for example, a data file containing a video image which consists of a solid block of a particular color, in RGB format, one kilopixels wide by one-half kilopixels tall. The one-thousand-five-hundred-thirty-six-byte file will simply be repeated strings of length three, one byte each for the red, green, and blue pixel values. This file may be adequately represented by a three-byte string representing the RGB values, a three-byte length indicator indicating how many of the strings to copy, and a one-byte header indicating the particular pre-processing function employed. This RLE-like seven-byte file achieves a remarkable compression ratio of over 74,898:1.

A compressing pre-processor may be used upon the data file as a whole, filling the input buffer of the Chambers' Pairs data compressor. What the Chambers' Pairs data compressor sees as an input block will, in this instance, contain more than one block's worth of data from the data file.

Furthermore, these and other such pre-processing filters may be used in conjunction with the Chambers' Pairs data compressor and data decompressor, either upon entire data files, or upon individual history-buffer-size blocks. Thus, a compressed data file may include: blocks which are compressed with the Chambers' Pairs method only, blocks which are pre-processed and then compressed with the Chambers' Pairs method, blocks which are pre-processed only, and incompressible blocks which are copied.

In the preferred mode, however, pre-processing is not performed, in the interest of compression and decompression speed.

VI. SOFTWARE SOURCE CODE

The attached Software Source Code Appendix includes assembly source code according to the mode preferred by the inventor for performing the data compression method of the flowcharts of FIGS. 5-8 and the data decompression method of the flowchart of FIG. 9. The source code is written for the Motorola 68000 family of microprocessors, specifically as included in an Apple Macintosh computer. Those skilled in the art will appreciate that, because a principal goal of the present invention is improved compression and decompression speed, a variety of optimizations have been made in the source code. These optimizations are not necessarily required as part of the invention, but represent the inventor's preferred mode of using the invention. Source code for tangential aspects of the data compression and decompression system, such as those having to do with interfacing with the Macintosh operating system and the like, are omitted in the interest of providing a more clear and concise detailing of the preferred mode of practicing the essentials of the invention.

VII. EXEMPLARY DEVICES WITHIN THE SCOPE OF THIS DISCLOSURE

Figure 10:
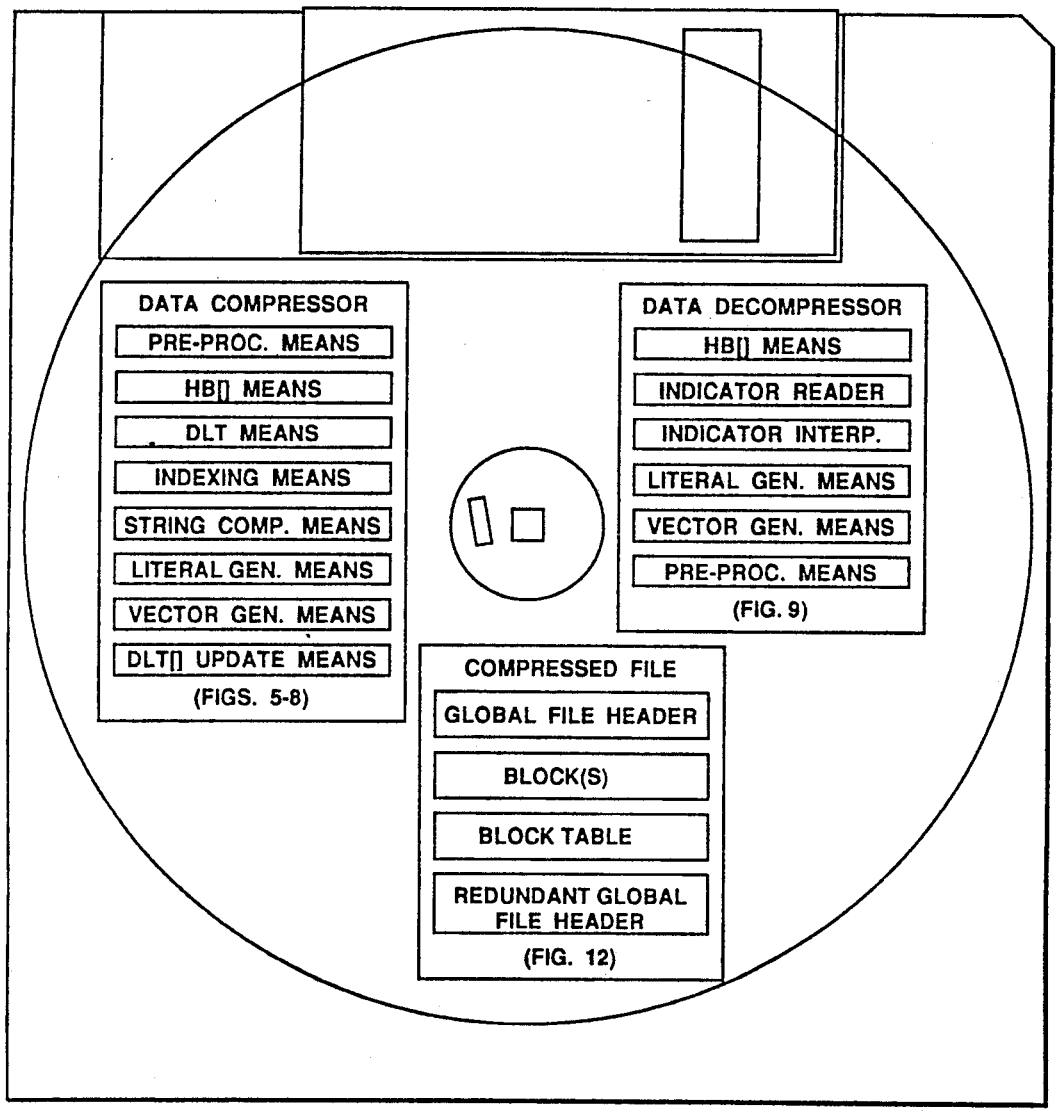

While FIGS. 1-3 illustrate environments in which the invention may be practiced, FIGS. 10-11 illustrate devices in which the invention may be embodied.

FIG. 10 symbolically shows the invention embodied as magnetic recording patterns in a recording medium such as a floppy disk. The invention may thus take a form known as software, which may typically be manufactured, sold, and used in floppy disk format. The invention may also be embodied in other recording media, such as magneto-optical discs, CD-ROM discs, tapes, or the like.

As seen, the data compressor may be understood to include a pre-processing means for performing D functions and the like, a history buffer means for maintaining the HB[] including its associated indices, a direct lookup table means for maintaining the DLT[], and an indexing means for forming the INDEX with the specified number of bytes at the current HB[] location. The data compressor further includes a string comparison means for performing the string matching functions described above, a literal generation means for generating literals and outputting them to the OB[], a vector generation means for generating vectors and outputting them to the OB[], and a DLT[] updating means for revising DLT entries to reflect newly-found strings. It will be understood that the data compressor means shown in FIG. 10 perform the method described above and shown in FIGS. 5-8, to generate a compressed data file according to the format described above and shown in FIG. 12.

As also seen in FIG. 10, the data decompressor may be understood to include a history buffer means for maintaining the HB[] including its associated indices, an indicator reader for fetching a next literal or vector indicator from the compressed data file, and an indicator interpreter for controlling high-level operation of the state machine. The data decompressor further includes literal generation means for fetching literal data from the compressed data file and outputting them to the HB[]. The data decompressor further includes a vector generation means for fetching and interpreting vectors from the compressed data file and for using them to duplicate vectored strings in the HB[]. The data decompressor further includes a pre-processing means for performing D functions and the like, in a post-processing manner, of course. It will be understood that the data decompressor means shown in FIG. 10 perform the method described above and shown in FIG. 9, to convert a compressed data file according to the format described above and shown in FIG. 12 into a decompressed data file.

Similarly, FIG. 11 symbolically shows the invention embodied as logic or memory patterns in a logic device such as a ROM, PROM, PLA, or the like. The invention may thus take a form known variously as firmware, hardware, or software, which may typically be manufactured, sold, and used in logic device format.

VIII. FILE FORMAT

Figure 12:
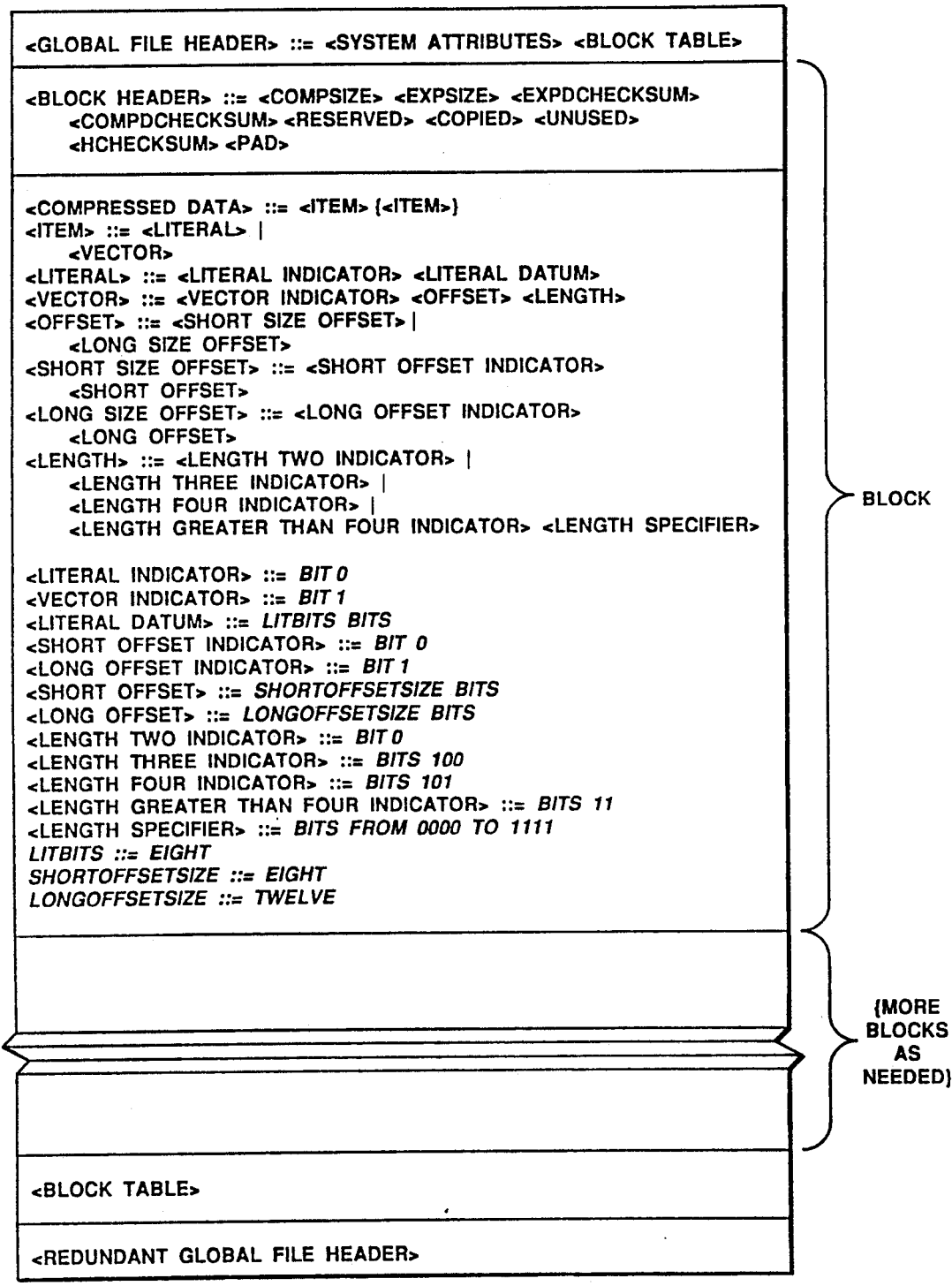
FIG. 12 illustrates a compressed data file according to the file format of the present invention.

FIG. 12 shows an exemplary compressed data file such as may be generated by the data compressor of the present invention, and such as may be decompressed by the data decompressor of the present invention. It may be possible to generate such a compressed data file by means other than the present data compressor; it may also be possible to recreate a corresponding non-compressed data file from such a compressed data file by means other than the present data decompressor. However, the compressed data file format itself has unique and advantageous attributes which lend a conforming compressed data file to very fast, efficient, and non-exploding data decompression.

The compressed data file includes one or more compressed data blocks, each of which includes a block header. As noted above, the block header may include an indication COMPSIZE of the compressed size of the block, an indication EXPSIZE of the expanded size of the block, a checksum EXPDCHECKSUM generated over the non-compressed data, a checksum COMPDCHECKSUM generated over the compressed data, a RESERVED item which is reserved for future implementations of the invention, a COPIED flag which indicates whether the block contains compressed or copied data, an UNUSED item which also is reserved for future implementations, a PAD item which indicates a number of bytes required to pad the compressed data (out to a multiple of four bytes on the preferred host computer), and a checksum HCHECKSUM generated over the block header.

In FIG. 12, the file format is described in terms of the well-known and commonly-accepted Backus-Naur or Backus Normal Form (BNF). In BNF, the symbols "<" and ">" delimit an item; the operator "::=" means "is defined as"; the symbols "{" and "}" delimit an item to be repeated zero or more times; spaces between juxtaposed items are ignored; juxtaposed items are included in the indicated order; the symbol "|" indicates alternative items to be selected in the alternative only; and juxtaposition has higher precedence than the "|" operator. For the reader s convenience, constant values are shown in italics.

The BNF description of FIG. 12 depicts the preferred mode of the file format. However, the file format will vary in accordance with the variable and optional features of the data compressor and decompressor detailed above. For example, if the data compressor is constructed such that alternative length offsets are disallowed, then

<OFFSET> ::= <SHORT OFFSET> for example.

The compressed data file includes, as noted above, a global file header The global file header contains the system attributes necessary for restoring the original non-compressed data file according to whatever host computer system is employed. In the preferred host environment of the Macintosh computer, the system attributes may include the original file's "type", "creator", and the like. The global file header may be physically located at any desired location within the compressed data file. In one mode, the global file header is at the beginning of the compressed data file.

In one mode, the compressed data file may also include a redundant global file header, which is simply a duplicate copy of the global file header. The redundant global file header is to be used in case the main global file header becomes corrupted or inaccessible. In one mode, the redundant global file header is placed as far away from the main global file header as possible, in order to minimize the likelihood that both will be corrupted or lost. In one mode, the redundant global file header is, therefore, appended at the end of the compressed data file.

The compressed data file further includes a block table BT[]. If the compressed data file includes J blocks (compressed or otherwise), the block table includes I entries, where $I = J + 1$ Each BT entry includes a pointer or index to an individual one of the blocks. The extra entry may be used to point to or index a location where a next block will be placed upon its creation.

In one mode, the BT entries are sequential such that BT[0] points to the first block, BT[1] points to the second block, and so forth. This is, however, an optional feature. In other modes, it may be desirable that the BT entries operate in random order, to perhaps permit better utilization of storage media, or to reduce processing requirements and bandwidth utilization should it become necessary to move a block's data, if, for example, that data increases in size at a write operation.

The BT[] provides a most desirable advantage when dealing with compressed data files specifically in that the BT[] provides a very efficient means of randomly accessing data in a compressed data file. If, for example, the user or other entity requests (reads) data from a given location in the middle of a very large compressed data file, it is not desirable that all data from the start of the compressed data file up to that point should be decompressed. Rather, it is desirable that only the one individual block which contains the requested data should be decompressed. Typically, the user's data request will make reference to the non-compressed data file, perhaps simply as an offset LOCATION from the beginning-of-file.

In one mode, in which each block in a compressed data file has been generated from history buffer(s) of identical size HBSIZE, in order to identify which individual block BLOCKNUM contains the requested data, the data decompressor need only perform the operation BLOCKNUM = LOCATION div HPSIZE and BLOCKNUM will then indicate the correct individual block.

In another, more general mode, in which the individual compressed data blocks in a compressed data file are not necessarily generated from history buffers of a single size, in order to identify which individual block BLOCKNUM contains the requested data, the data decompressor may perform operations according to the following pseudocode.

TABLE 8

Random Access Method

POSITION = 0;
BLOCKNUM = 0;
repeat
   POSITION = POSITION + BT[BLOCKNUM];
   BLOCKNUM = BLOCKNUM + 1;
until POSITION > LOCATION;
BLOCKNUM = BLOCKNUM - 1; /* went one too far */

Then, in either mode, the data decompressor need only decompress the single block identified by BLOCKNUM. If the requested data are large enough to extend into one or more logically subsequent blocks, those blocks will also need to be decompressed.

In another mode, each BT entry could further include an identification of the logical beginning offset of its data in the non-compressed data file, in which case the random access could be speeded up, albeit at the expense of a somewhat lower overall compression ratio.

On the preferred Macintosh host, any given file may include a "resource fork" and/or a "data fork". The two forks are associated but independent, and each may be thought of as a separate file. In one mode, the global file header includes an identification of the non-compressed size of each, and the compressed data blocks of a prespecified one of the forks precede the compressed data blocks of the other fork in the compressed data file. Thus, to access data in the second (other) fork, the above-indicated random accessing schemes may be augmented by adding the size of the non-compressed first (one) fork to LOCATION to access the correct BT entry.

Another particularly useful feature of the BT[] is that it may be used to reconstruct parts of damaged block headers. If, for example, the block header for compressed data block M has become corrupted such that its COMPSIZE indicator is incorrect, the data decompressor may calculate the correct COMPSIZE value as (BT[M+1]−BT[M])−BHSIZE where BHSIZE is the predefined size of a block header.

Figure 13:
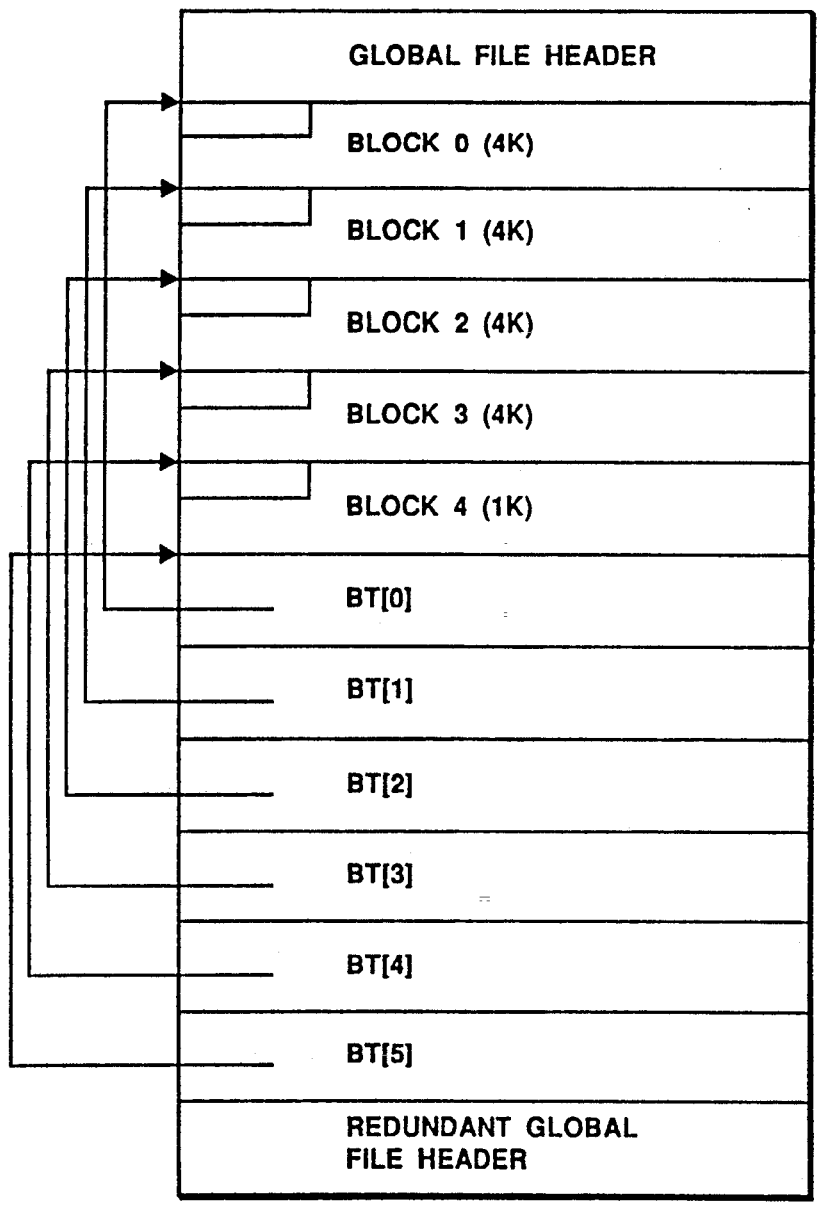
FIG. 13 illustrates a compressed data file, specifically pointing out the block table entries.

FIG. 13 illustrates a compressed data file, specifically the BT[] thereof, according to the preferred mode, symbolically showing BT entries pointing to individual compressed data blocks. It will be understood that BT entries will point to all blocks in the compressed data file, whether compressed or copied. The compressed data file of FIG. 13 is the compressed equivalent of a data file of size 17 kilobytes, generated using a history buffer of size 4 kilobytes. Thus, the number of BT entries is $$I = ((17 \div 4) \text{ div } 4) + 1 = 6$$

where the 4 is added for rounding correction and the 1 is added for indexing the next available block location (i.e. because I=J+1, as noted above). In FIG. 13, the notations (4K) and (1K) are intended to identify the non-compressed size of the contents of the respective blocks. The compressed blocks, may, of course be smaller, and may be copied rather than compressed.

FIG. 10 illustrates a storage medium, such as a floppy disk, magneto-optical disc, CD-ROM disc, or the like, which contains a compressed data file according to the file format of FIG. 12. It is obviously advantageous to pack as much data as possible onto a unit of storage media; data compression according to the above-described file format increases the effective quantity of data which will fit on a given unit of storage. It has become well-known in the art to ship data files, and even executable applications, in a compressed format. This reduces the manufacturer's production costs by reducing the quantity of storage media units which must be purchased, and by reducing the drive time required to make individual copies of the shipping data or applications, and further by reducing the weight of the final packaged product.

Products such as shown in FIG. 10 may be shipped with or without the data compressor, and with or without the data decompressor. The manufacturer may simply rely on the purchaser to already have a separate copy of the data decompressor. Alternatively, the data decompressor may be included in the compressed data file in a format known as a "self-extracting archive". As another alternative, the data decompressor may be built into the drive for which the storage media unit is designed, such as into the CD-ROM drive if FIG. 10 shows a CD-ROM disc.

FIG. 11 similarly shows a logic device in which a compressed data file is embodied. Again, this may be with or without the data compressor, and with or without the data decompressor. For example, it may prove advantageous to embed seldom-used routines in a ROM according to FIG. 11, reducing the quantity of available addressable memory used up by those routines, and freeing the difference in memory size for other uses. In this case, the data compressor could be embodied as a hardware front-end (not shown) responsive to the address decoding mechanism which enables the given ROM. Other similar schemes are within the ability of those having skill in the art.

IX. OTHER USES OF THE DLT[INDEX] METHODOLOGY

It will be understood that the heart of this invention lies in the methodology of using a current and next byte from the input data as an INDEX into the DLT[] to access a potential pointer to a previously-found instance of a string which begins with the same two bytes. The literal output and vector output methodologies are useful in adapting the invention for use as a data compression system, which is the preferred embodiment. It will be further understood that the heart of the invention is readily usable in other embodiments, as well.

For example, the DLT[] indexing methodology may advantageously be utilized in any string searching environment, such as in the well-known environment of "grep" searching. While the invention has been described with reference to the embodiment of a data compression system, its use in any suitable embodiment is contemplated. Various changes in the form and details discussed herein are possible within the scope of this disclosure, including but not limited to those discussed above. However, the invention is to be afforded protection according to the scope of the following claims.

I claim:
1. An apparatus operating upon an input data block, the apparatus comprising:
    means for maintaining a direct lookup table (DLT) array of DLT entries, each DLT entry being indexable in the DLT by a unique integer and identifying a location in the input data block; and
    indexing means for using one or more bytes at a current location in the input data block as an integer to directly access a given DLT entry, contents of the given DLT entry identifying a target location in the input data block.
2. The apparatus of claim 1, wherein target strings begin at target locations in the input data block and a current string begins at the current location, the apparatus further comprising:
    string comparison means for determining whether a target string at a target location identified by the given DLT entry matches the current string.
3. The apparatus of claim 2, further comprising:
    data compression means for compressing the input data block responsive to the string comparison means, to generate a compressed data block.
4. The apparatus of claim 3, wherein the data compression means comprises:
    literal means, responsive to a determination by the string comparison means that the target and current strings do not match, for outputting to the compressed data block a literal representing a datum at the current location; and
    vector means, responsive to a determination by the string comparison means that the target and current strings match, for outputting to the compressed data file a vector to the target string.
5. The apparatus of claim 1, wherein:
    the indexing means uses N bytes at the current location to index the DLT, where N is an integer; and the means for maintaining the DLT maintains the DLT to comprise $2^{8 \times N}$ DLT entries.

6. The apparatus of claim 5, wherein:
the DLT comprises sixty-four kiloentries ($2^{2 \times 8}$ DLT entries); and
the indexing means uses a current byte at the current location and a next byte at a next subsequent location to index the DLT.

7. A data compressor for compressing an input data block into a compressed data block, the data compressor comprising:
means for maintaining a direct lookup table (DLT) array of DLT entries, each DLT entry being indexable in the DLT by a unique integer and identifying a location in the input data block;
indexing means for using data at a current location in the input data block as an integer to directly access a given DLT entry, contents of the given DLT entry identifying a target location in the input data block;
string comparison means for determining whether a target data string at the target location matches a current data string at the current location;
literal means, responsive to a determination by the string comparison means that the data strings do not match, for outputting to the compressed data block a literal representing a datum at the current location;
vector means, responsive to a determination by the string comparison means that the data strings match, for outputting to the compressed data file a vector to the target string; and
means for updating the given DLT entry to identify the current location.

8. The data compressor of claim 7, further comprising:
means for maintaining the input data block in a history buffer.

9. The data compressor of claim 7, wherein the literal comprises:
a literal indicator; and
the datum at the current location.

10. The data compressor of claim 9, wherein the literal indicator comprises:
the bit $0_2$.

11. The data compressor of claim 7, wherein the vector comprises:
a vector indicator;
an offset from the current location to the target location; and
a length of the current string which matches the target match string.

12. The data compressor of claim 11, wherein the vector indicator comprises:
the bit $1_2$.

13. The data compressor of claim 11, wherein the offset comprises:
one of a plurality of special case offsets.

14. The data compressor of claim 11, wherein the offset comprises:
an offset length indicator indicating a number of offset value bits; and
an offset value of the indicated number of bits.

15. The data compressor of claim 14, wherein the offset length indicator comprises:
a short offset indicator; or
a long offset indicator.

16. The data compressor of claim 15, wherein:
the vector means is further for outputting a short offset vector when the offset from the current string to the matching string can be vectored with a short offset vector.

17. The data compressor of claim 15, wherein:
the short offset indicator comprises the bit $0_2$ and specifies an eight-bit offset; and
the long offset indicator comprises the bit $1_2$ and specifies a twelve-bit offset.

18. The data compressor of claim 11, wherein the length comprises:
one of a plurality of special case length identifiers.

19. The data compressor of claim 11, wherein the length comprises:
the bit $0_2$ specifying a matching string length of two;
the bits $100_2$ specifying a matching string length of three;
the bits $101_2$ specifying a matching string length of four; or
the bits $11_2$ specifying a matching string length of greater-than-four, and a length specifier specifying how much greater than four the matching string length is.

20. The data compressor of claim 19, wherein the length specifier comprises:
four bits in the range $0000_2$ to $1111_2$ for adding to five, to specify a matching string length in the range of five to twenty.

21. The data compressor of claim 7, further comprising:
header means for outputting a block header to the compressed data block.

22. The data compressor of claim 21, wherein the block header comprises:
an indication of a size of the input data block.

23. The data compressor of claim 21, wherein the header means further comprises:
means for generating a checksum over the compressed data block.

24. The data compressor of claim 7, further comprising:
means for pre-processing the input data block.

25. The data compressor of claim 24, wherein the means for pre-processing comprises:
means for performing a D function on the input data block.

26. A data decompressor for decompressing a compressed data block, the data decompressor comprising:
means for maintaining an output data block, the output data block including a current location;
means for reading an indicator from the compressed data block;
means for determining whether the indicator is a literal indicator or a vector indicator;
literal means, responsive to a determination that the indicator is a literal indicator, for copying a literal datum from the compressed data block to the current location;
vector means, responsive to a determination that the indicator is a vector indicator, for copying a string from a previous location in the output data block to the current location; and
means for updating the current location to a new current location beyond the literal datum copied by the literal means or the string copied by the vector means.

27. The data decompressor of claim 26, wherein the literal indicator comprises:

the bit $0_2$.

28. The data decompressor of claim 26, wherein:
the compressed data block includes a vector including the vector indicator and an offset indicator and a length indicator;
the vector means is further for calculating an offset from the current location to the previous location according to the length indicator;
the vector means is further for calculating a string length according to the length indicator; and
the string copied by the vector means has the calculated string length.

29. The data decompressor of claim 28, wherein the vector indicator comprises:
the bit $1_2$.

30. The data decompressor of claim 28, wherein the offset indicator comprises:
an offset length indicator indicating a number of offset value bits; and
an offset value of the indicated number of offset value bits.

31. The data decompressor of claim 30, wherein the offset length indicator comprises:
a short offset indicator; or
a long offset indicator.

32. The data decompressor of claim 31, wherein:
the short offset indicator comprises the bit $0_2$ and specifies an eight-bit offset; and
the long offset indicator comprises the bit $1_2$ and specifies a twelve-bit offset.

33. The data decompressor of claim 28, wherein:
the length indicator comprises the bit $0_2$, and the vector means copies a string of length two responsive thereto;
the length indicator comprises the bits $100_2$, and the vector means copies a string of length three responsive thereto;
the length indicator comprises the bits $101_2$, and the vector means copies a string of length four response thereto; or
the length indicator comprises the bits $11_2$ and a plurality of additional length indicator bits, and the vector means copies a string of length greater than four in response thereto.

34. The data decompressor of claim 26, wherein:
the means for maintaining the output data block maintains the output data block in a history buffer.

35. The data decompressor of claim 32, wherein the compressed data block includes a header specifying a decompressed size of the compressed data block, and wherein:
the means for maintaining the output data block selects a size of the history buffer according to the decompressed size specified in the header.

36. The data decompressor of claim 35, wherein the header further specifies a pre-processing technique, the data decompressor further comprising:
means for performing the specified pre-processing technique upon the compressed data block before operation of the means for reading, means for determining, literal means, vector means, and means for updating operate upon the compressed data block.

37. The data decompressor of claim 36, wherein:
the specified pre-processing technique is a D function.

38. A data compression method for compressing an input data block into a compressed data block, the data compression method comprising the steps of:
A) maintaining a direct lookup table (DLT) of entries, each entry identifying a location in the input data block;
B) selecting a current location in the input data block, a current data string existing at the current location;
C) indexing an entry in the DLT with data at the current location to identify a target location in the input data block, a target data string existing at the target location;
D) comparing the target data string to the current data string to determine whether the data strings match;
E) responsive to a determination by the comparing step that the data strings do not match,
E1) outputting the current data string as literal data to the compressed data block, and
E2) updating the entry in the DLT indexed by the indexing step to identify the current location;
F) responsive to a determination by the comparing step that the data strings match,
F1) calculating an offset from the current location to the target location,
F2) determining a length of the matching current data string, and
F3) outputting the offset calculated in the calculating step and the length determined in the determining step as a vector to the compressed data block;
G) advancing the current location past the current data string; and
H) repeating steps C) to G) until the current location is not within the input data buffer, to compress the entire input data buffer.

39. A data decompression method of decompressing a compressed data block to form an output block, the compressed data block including literal data having literal indicators and further including vectors having vector indicators, a vector including an offset and a length, the method comprising the steps of:
A) reading an indicator from the compressed data block;
B) determining whether the indicator read is a literal indicator or a vector indicator; if the indicator read is a literal indicator,
C) copying a literal datum from the compressed data block to a current location in the output block; if the indicator read is a vector indicator,
D) reading an offset from the compressed data block;
E) reading a length from the compressed data block;
F) copying the read length of data from the output block at a location indicated by the read offset to a current location in the output block; and
G) updating the current location in the output block to a location beyond the literal datum copied in step C) or the data copied in step F).

40. A compressed data file including one or more compressed data blocks, a compressed data block comprising:
a literal including,
a literal indicator, and
a literal datum; and
a vector including, a vector indicator,
an offset, and
a length.

41. The compressed data file of claim 40, wherein said offset comprises:
an offset size indicator; and
an offset indicator.

42. The compressed data file of claim 41, wherein:
said offset size indicator comprises a short offset indicator; and
said offset indicator comprises a short offset.

43. The compressed data file of claim 42, wherein:
said short offset indicator comprises the bit $0_2$; and
said short offset comprises eight bits.

44. The compressed data file of claim 41, wherein:
said offset size indicator comprises a long offset indicator; and
said offset indicator comprises a long offset.

45. The compressed data file of claim 44, wherein:
said long offset indicator comprises the bit $1_2$; and
said long offset comprises twelve bits.

46. The compressed data file of claim 40, wherein:
said length comprises one of a plurality of special case length indicators.

47. The compressed data file of claim 46, wherein said plurality of special case length indicators comprises:
a length two indicator;
a length three indicator;
a length four indicator; and
a length greater-than-four indicator.

48. The compressed data file of claim 47 wherein said length greater-than-four indicator includes:
a length specifier.

49. The compressed data file of claim 47, wherein said length two indicator comprises:
the bit $0_2$.

50. The compressed data file of claim 47, wherein said length three indicator comprises:
the bits $100_2$.

51. The compressed data file of claim 47, wherein said length four indicator comprises:
the bits $101_2$.

52. The compressed data file of claim 47, wherein said length greater-than-four indicator comprises:
the bits $11_2$; and
a length specifier including four bits.

53. The compressed data file of claim 40, wherein:
said lateral indicator comprises the bit $0_2$; and
said literal datum comprises eight bits.

54. Compressed data according to a format, said format comprising, in Backus Normal Form (BNF):

```
<compressed data> ::= <item> {<item>}
<item> ::= <literal> |
           <vector>
<literal> ::= <literal indicator> <literal datum>
<vector> ::= <vector indicator> <offset> <length>
```

55. The compressed data of claim 54, wherein said format further comprises, in BNF:

```
<offset> ::= <short size offset> |
             <long size offset>
<short size offset> ::= <short offset indicator>
                        <short offset>
<long size offset> ::= <long offset indicator>
                       <long offset>
```

56. The compressed data of claim 54, wherein said format further comprises, in BNF:

```
<length> ::= <length two indicator> |
             <length three indicator> |
             <length four indicator> |
             <length greater than four indicator> <length specifier>
```

* * * * *

UNITED STATES PATENT AND TRADEMARK OFFICE
CERTIFICATE OF CORRECTION

PATENT NO. : 5,155,484

DATED : October 13, 1992

INVENTOR(S) : Lloyd L. Chambers, IV

It is certified that error appears in the above-identified patent and that said Letters Patent is hereby corrected as shown below:

| | |
|---|---|
| Column 5, line 47, | "21" should be --212--; |
| Column 8, line 20, | "tat" should be --that--; |
| Column 9, line 41, | "t" should be --to--; |
| Column 10, line 26, | "was" should be --has--; |
| Column 10, line 48, | "02" should be --$O_2$-- |
| Column 10, line 66, | "a" should be --at--; |
| Column 18, line 48, | after "($O_2$)" there should be a period --.-- |
| Column 27, line 32, | after the first "header" there should be a period --.--; |
| Column 28, line 26, | "HPSIZE" should be --HBSIZE--; |
| Column 34, line 47, | after the semicolon there should be a new paragraph; and |
| Column 34, line 51, | after the semicolon there should be a new paragraph. |

Signed and Sealed this

Seventeenth Day of January, 1995

*Attest:*

*Attesting Officer*

BRUCE LEHMAN

*Commissioner of Patents and Trademarks*